(12) United States Patent
Tsuduki et al.

(10) Patent No.: US 9,253,922 B2
(45) Date of Patent: Feb. 2, 2016

(54) ELECTRONIC COMPONENT AND ELECTRONIC APPARATUS

(71) Applicant: CANON KABUSHIKI KAISHA, Tokyo (JP)

(72) Inventors: Koji Tsuduki, Kawasaki (JP); Takanori Suzuki, Tokyo (JP); Tadashi Kosaka, Atsugi (JP); Yasuhiro Matsuki, Atsugi (JP); Shin Hasegawa, Hadano (JP); Hisatane Komori, Ayase (JP); Yasushi Kurihara, Hiratsuka (JP); Fujio Ito, Yokohama (JP); Kazuya Notsu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/869,779

(22) Filed: Apr. 24, 2013

(65) Prior Publication Data

US 2013/0286592 A1 Oct. 31, 2013

(30) Foreign Application Priority Data

Apr. 27, 2012 (JP) ................................ 2012-103827
Feb. 28, 2013 (JP) ................................ 2013-039451

(51) Int. Cl.
*H05K 5/00* (2006.01)
*H05K 1/02* (2006.01)
*H05K 3/34* (2006.01)
*H05K 7/20* (2006.01)
(Continued)

(52) U.S. Cl.
CPC .............. *H05K 7/2039* (2013.01); *H01L 21/50* (2013.01); *H01L 23/055* (2013.01); *H01L 2224/48091* (2013.01); *H01L 2224/49171* (2013.01); *H01L 2224/73265* (2013.01); *H01L 2224/78301* (2013.01); *H01L 2224/85181* (2013.01); *H01L 2224/92247* (2013.01); *H01L 2924/3025* (2013.01)

(58) Field of Classification Search
USPC ......................................................... 257/678
See application file for complete search history.

(56) References Cited

U.S. PATENT DOCUMENTS 3,622,419 A   11/1971   London et al.
4,604,677 A   8/1986    Suzuki et al.
(Continued)

FOREIGN PATENT DOCUMENTS

CN   1160984 A   10/1997
CN   1227411 A   9/1999
(Continued)

OTHER PUBLICATIONS

U.S. Appl. No. 13/869,829, filed Apr. 24, 2013, Koji Tsuduki.
(Continued)

*Primary Examiner* — Telly Green
(74) *Attorney, Agent, or Firm* — Canon U.S.A., Inc. IP Division

(57) ABSTRACT

A package includes a base body to which an electronic device is fixed, a lid body that faces the electronic device, and a frame body that encloses at least one of a space between the electronic device and the lid body, and the electronic device. The frame body has a first portion located at a side of an inner edge of the frame body with respect to an outer edge of the base body, and a second portion located at a side of an outer edge of the frame body with respect to the outer edge of the base body, in an X direction from the inner edge of the frame body toward the outer edge of the frame body.

21 Claims, 10 Drawing Sheets

(51) Int. Cl.
*H01L 23/055* (2006.01)
*H01L 21/50* (2006.01)

(56) References Cited

U.S. PATENT DOCUMENTS

| | | |
|---|---|---|
| 5,195,023 A | 3/1993 | Manzione et al. |
| 5,200,367 A | 4/1993 | Ko |
| 5,458,716 A | 10/1995 | Alfaro et al. |
| 5,481,136 A | 1/1996 | Kohmoto et al. |
| 5,744,863 A | 4/1998 | Culnane |
| 5,828,127 A | 10/1998 | Yamagata et al. |
| 6,011,697 A | 1/2000 | Budnaitis et al. |
| 6,268,231 B1 | 7/2001 | Wetzel |
| 6,611,056 B2 | 8/2003 | Okamoto et al. |
| 6,906,412 B2 | 6/2005 | Furukubo et al. |
| 6,953,891 B2 | 10/2005 | Bolken et al. |
| 6,979,595 B1 | 12/2005 | James et al. |
| 7,417,198 B2 | 8/2008 | Betz et al. |
| 7,646,094 B2 | 1/2010 | Suminoe |
| 8,053,953 B2 | 11/2011 | Yamada |
| 8,058,720 B2 | 11/2011 | Chen et al. |
| 8,217,556 B2 * | 7/2012 | Yamada .................. 310/370 |
| 8,243,461 B2 | 8/2012 | Uchida et al. |
| 8,816,574 B2 * | 8/2014 | Yamada .................. 310/370 |
| 8,823,248 B2 * | 9/2014 | Yamada .................. 310/370 |
| 2002/0020916 A1 | 2/2002 | Ito |
| 2003/0161109 A1 | 8/2003 | Kurihara et al. |
| 2004/0046247 A1 | 3/2004 | Tower |
| 2004/0177984 A1 | 9/2004 | Groothuis et al. |
| 2005/0174469 A1 | 8/2005 | Cho |
| 2007/0194418 A1 * | 8/2007 | Suminoe .................. 257/678 |
| 2007/0200053 A1 | 8/2007 | Nomura |
| 2008/0132002 A1 | 6/2008 | Inao et al. |
| 2008/0134631 A1 | 6/2008 | Kuboi |
| 2008/0292308 A1 | 11/2008 | Iwabuchi |
| 2009/0230486 A1 | 9/2009 | Shimodaira |
| 2010/0171397 A1 * | 7/2010 | Yamada .................. 310/370 |
| 2010/0315938 A1 | 12/2010 | Ascanio et al. |
| 2012/0187803 A1 * | 7/2012 | Yamada .................. 310/352 |
| 2013/0001398 A1 | 1/2013 | Wada et al. |
| 2013/0105205 A1 | 5/2013 | Takagi |
| 2013/0214405 A1 | 8/2013 | Bauer et al. |
| 2013/0241364 A1 * | 9/2013 | Yamada .................. 310/370 |
| 2013/0242524 A1 | 9/2013 | Chan |
| 2014/0237805 A1 | 8/2014 | Suzuki et al. |
| 2014/0240588 A1 | 8/2014 | Sakuragi et al. |
| 2014/0252569 A1 | 9/2014 | Ikuma et al. |
| 2014/0268594 A1 | 9/2014 | Wang et al. |
| 2014/0306582 A1 | 10/2014 | Matsuzawa et al. |

FOREIGN PATENT DOCUMENTS

| | | |
|---|---|---|
| CN | 1461053 | 12/2003 |
| CN | 1691344 A | 11/2005 |
| CN | 101312206 A | 11/2008 |
| CN | 101853827 A | 10/2010 |
| GB | 2007911 | 5/1979 |
| JP | S62-217640 A | 9/1987 |
| JP | S62-273768 A | 11/1987 |
| JP | H02-291153 A | 11/1990 |
| JP | 4-123462 A | 4/1992 |
| JP | H09-283664 A | 10/1997 |
| JP | 11354587 A | 12/1999 |
| JP | 2001-168443 A | 6/2001 |
| JP | 2001-308442 A | 11/2001 |
| JP | 2002-299486 A | 10/2002 |
| JP | 2003-101042 A | 4/2003 |
| JP | 2006-245090 A | 9/2006 |
| JP | 2007-208045 A | 8/2007 |
| JP | 2007-242908 A | 9/2007 |
| JP | 2008-245244 A | 10/2008 |
| JP | 2011-077080 A | 4/2011 |
| JP | 2011077080 A * | 4/2011 |
| JP | 2011-165745 A | 8/2011 |
| RU | 2198949 C2 | 2/2003 |
| RU | 2322729 C1 | 4/2008 |
| RU | 108263 U1 | 9/2011 |
| WO | 2004/064120 A2 | 7/2004 |
| WO | 2011043493 A1 | 4/2011 |
| WO | 2013-118501 A1 | 8/2013 |

OTHER PUBLICATIONS

U.S. Appl. No. 13/869,852, filed Apr. 24, 2013, Koji Tsuduki.

* cited by examiner

ELECTRONIC COMPONENT AND ELECTRONIC APPARATUS

BACKGROUND OF THE INVENTION

1. Field of the Invention

The present disclosure relates to conduction of heat generated at an electronic device in an electronic component.

2. Description of the Related Art

An electronic component including a package that houses an electronic device such as an image pickup device is required to have a structure for radiating heat generated at the electronic device.

Japanese Patent Laid-Open No. 2008-245244 discloses a support body that includes a main body part made of a ceramic material and a mount part made of a metal material and that has high heat radiation performance.

In Japanese Patent Laid-Open No. 2008-245244, the mount part is jointed at the outer circumference of the main body part. Hence, the contact area between the mount part and the main body part is not sufficient. Owing to this, thermal conduction from the main body part to the mount part is inefficient.

SUMMARY OF THE INVENTION

A main point of this disclosure is an electronic component including a package that houses an electronic device. The package includes a base body to which the electronic device is fixed, a lid body that faces the electronic device, and a frame body that encloses at least one of a space between the electronic device and the lid body, and the electronic device. The frame body has a first portion located at a side of an inner edge of the frame body with respect to an outer edge of the base body, and a second portion located at a side of an outer edge of the frame body with respect to the outer edge of the base body, in a direction from the inner edge of the frame body toward the outer edge of the frame body. The second portion has a greater length in the direction than a length of the first portion in the direction.

According to an aspect, a thickness of the first portion is less than the length of the first portion in the direction, and the base body and the frame body have greater thermal conductivities than a thermal conductivity of the lid body. According to another aspect, the frame body may have a greater thermal conductivity than a thermal conductivity of the base body.

Further features of the present invention will become apparent from the following description of exemplary embodiments with reference to the attached drawings.

DESCRIPTION OF THE EMBODIMENTS

Figure 1A:
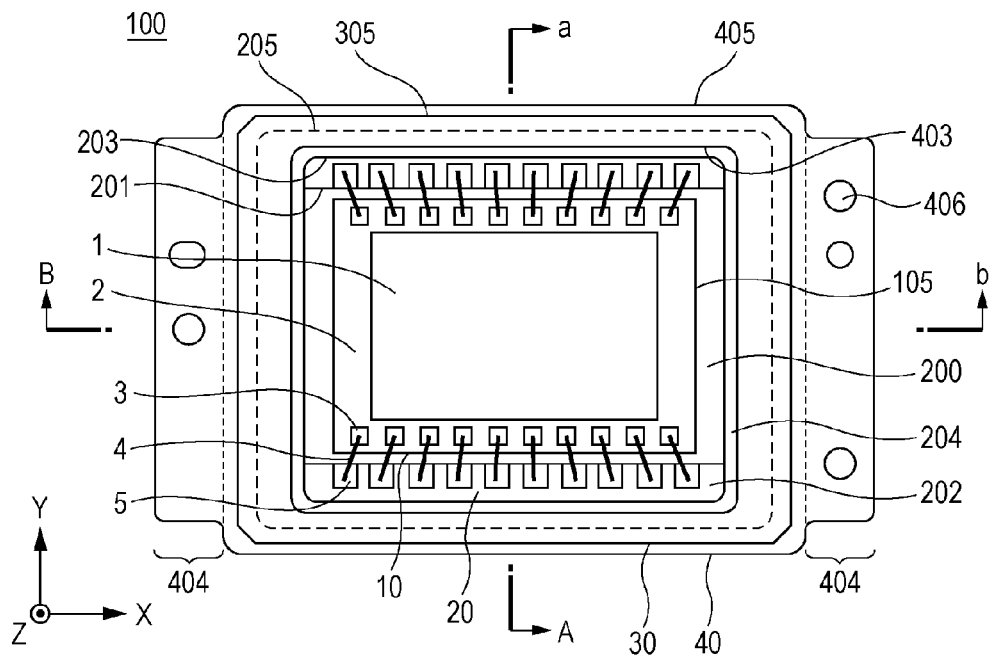
FIGS. 1A and 1B are schematic plan views of an example of an electronic component.
Figure 1B:
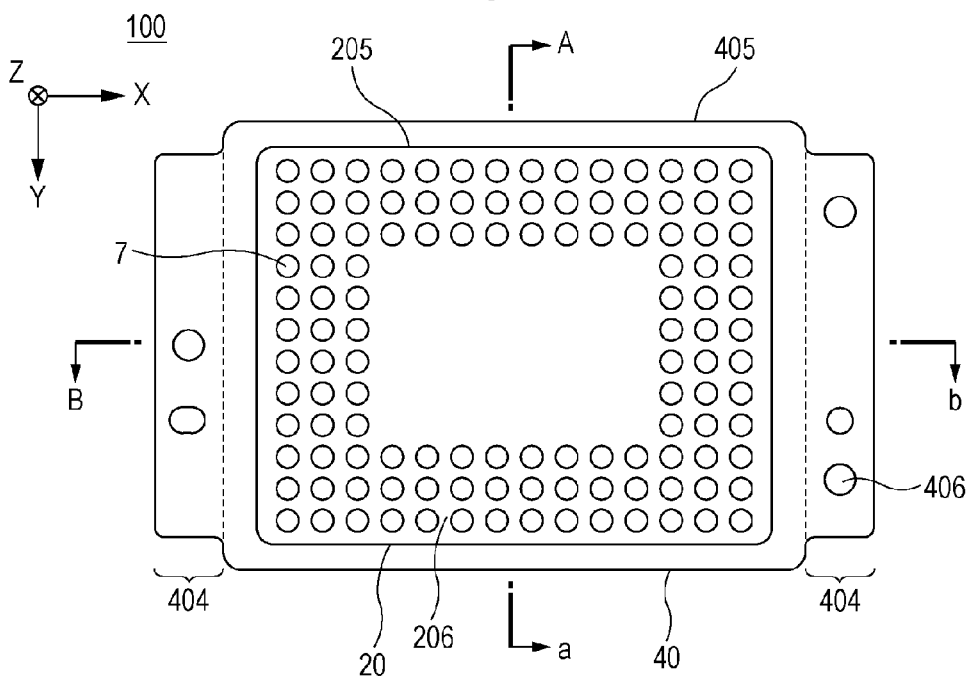
Figure 2A:
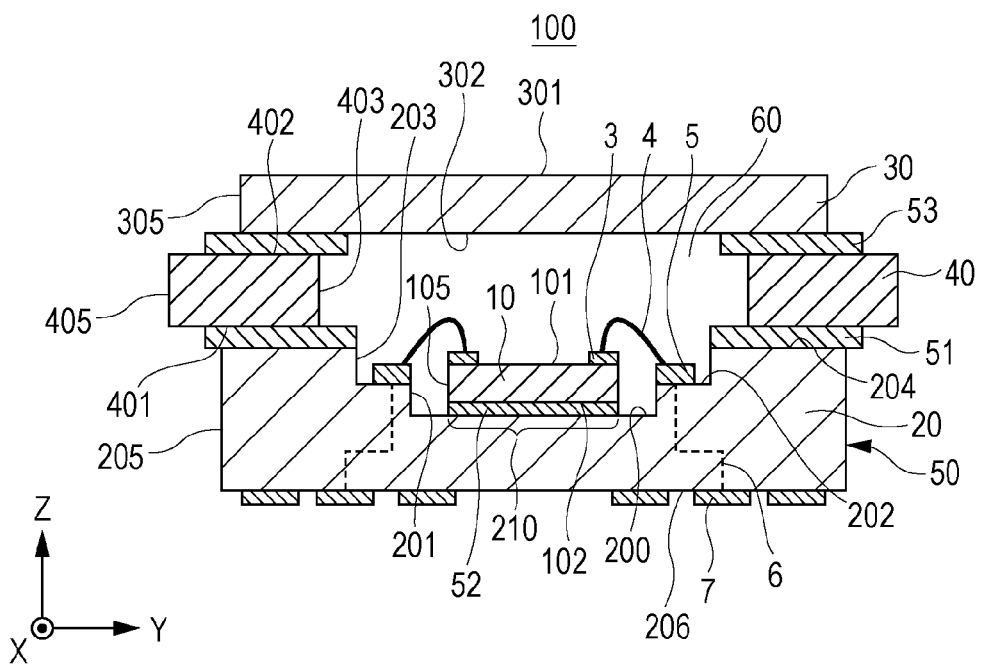
FIGS. 2A and 2B are schematic sectional views of the example of the electronic component.
Figure 2B:
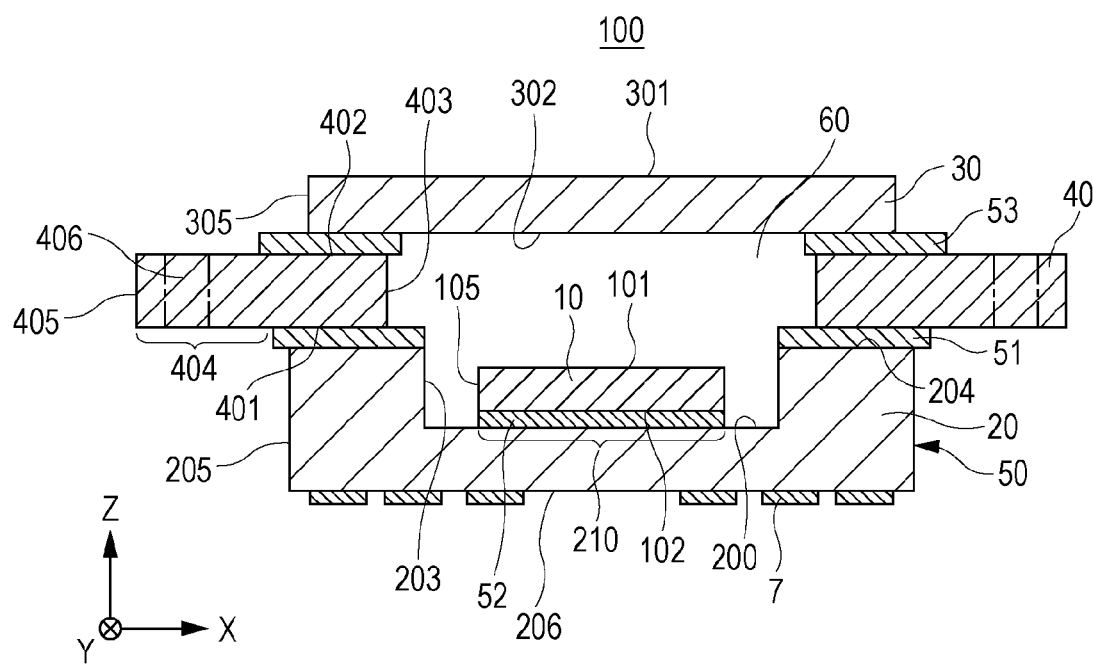
Figure 3A:
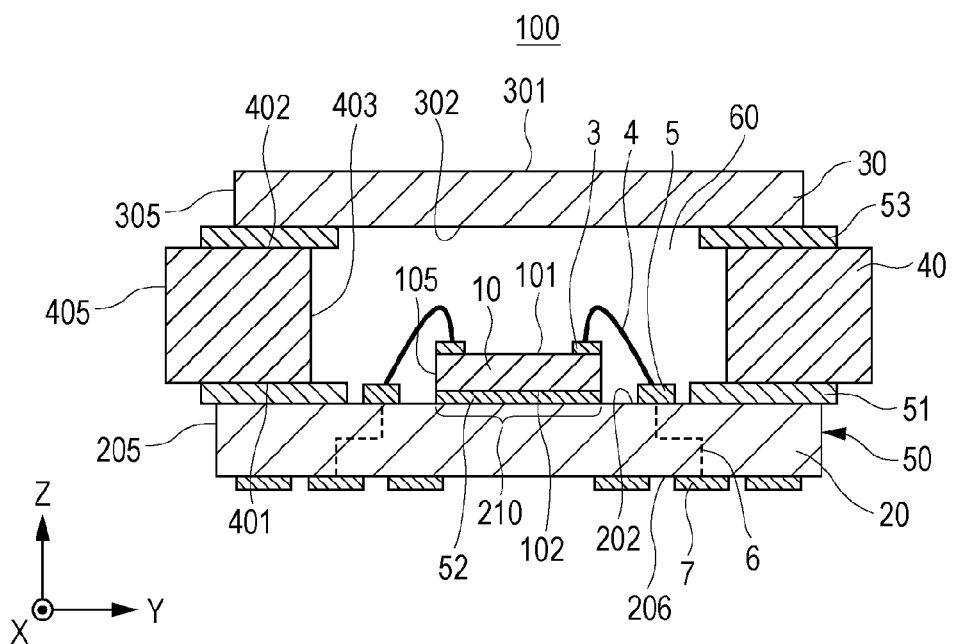
FIGS. 3A and 3B are schematic sectional views of an example of an electronic component.
Figure 3B:
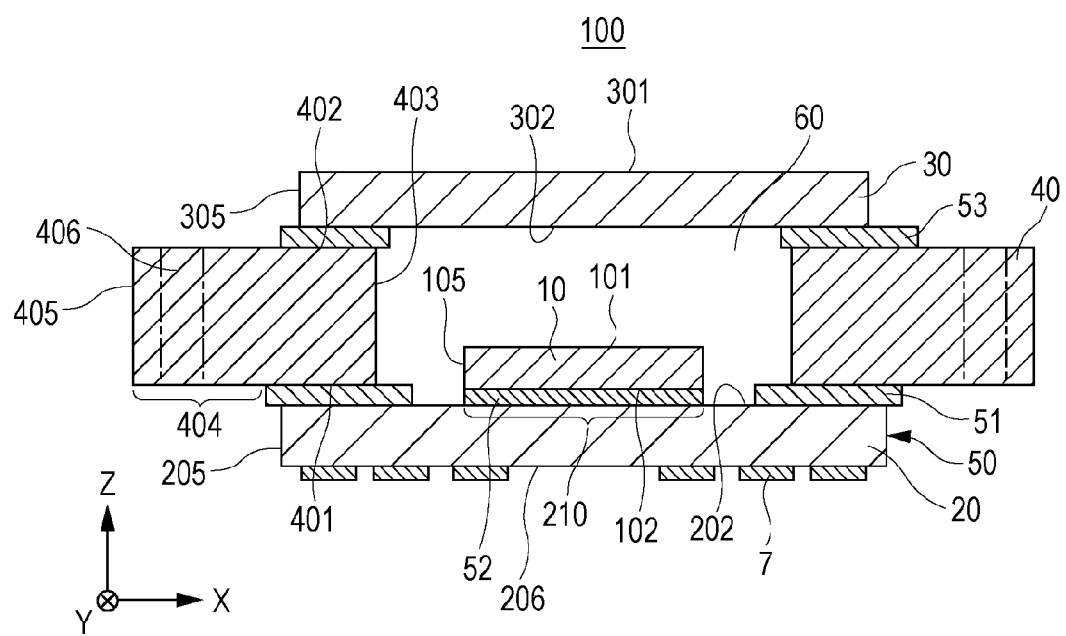
Figure 4:
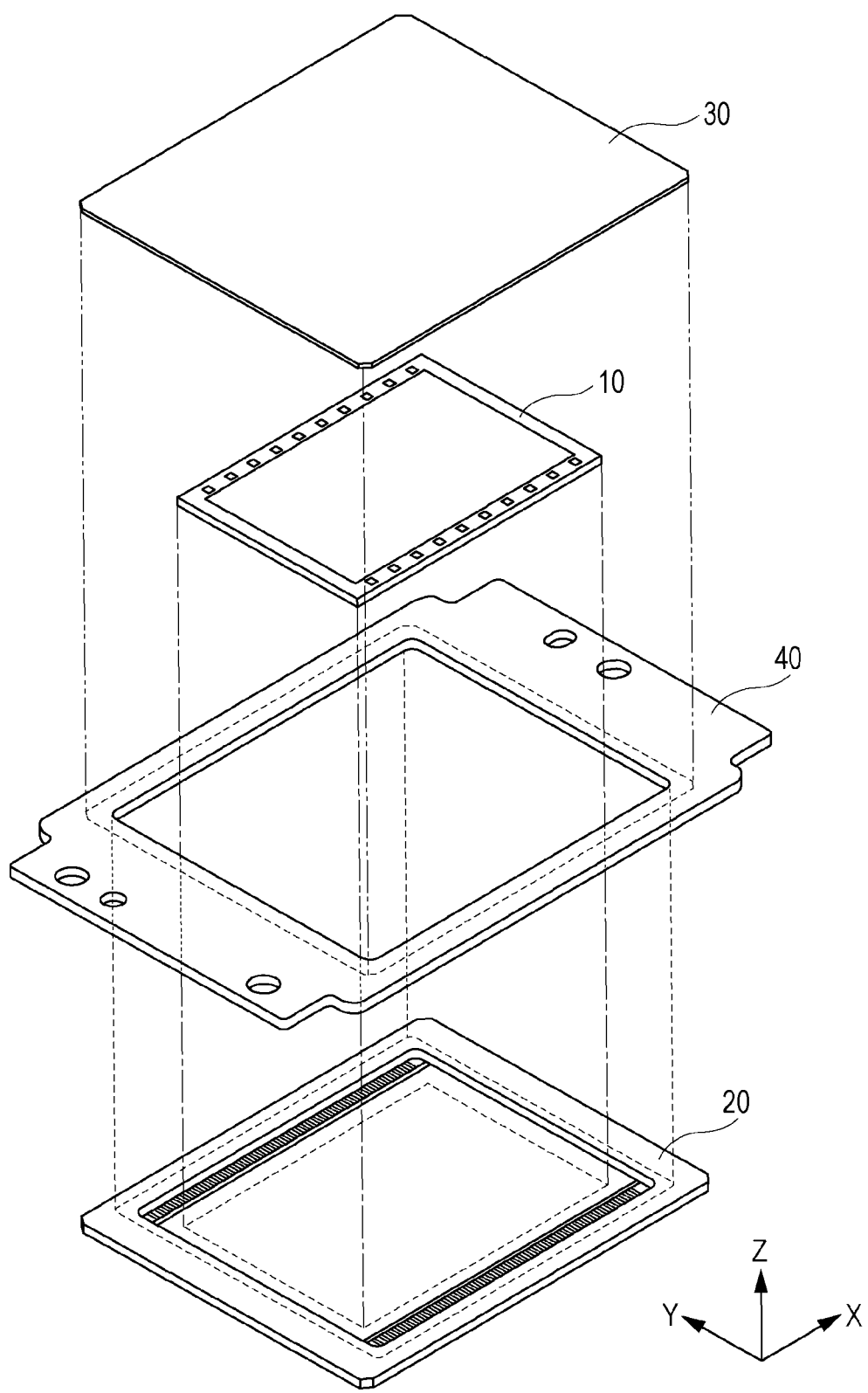
FIG. 4 is an exploded perspective view of the example of the electronic component.

Examples of electronic components 100 are described as embodiments of the present disclosure. FIG. 1A is a schematic plan view when an electronic component 100 is viewed from the front. FIG. 1B is a schematic plan view when the electronic component 100 is viewed from the back. FIGS. 2A and 2B are schematic sectional views of the electronic component 100. FIG. 2A is a sectional view of the electronic component 100 taken along line A-a in FIGS. 1A and 1B. FIG. 2B is a sectional view of the electronic component 100 taken along line B-b in FIGS. 1A and 1B. FIGS. 3A and 3B are sectional views of a modification of an electronic component 100 taken along lines similar to those of FIGS. 2A and 2B. FIG. 4 is an exploded perspective view of the electronic component 100. Description is given below with reference to the drawings while common reference signs are applied to the same members. The respective drawings indicate the X direction, Y direction, and Z direction.

The electronic component 100 includes an electronic device 10, and a package 50 that houses the electronic device 10. The package 50 mainly includes a base body 20, a lid body 30, and a frame body 40. Although the detail is described later, the base body 20 and the frame body 40 from among parts of the package 50 may function as a mounting member. The lid body 30 may function as an optical member. The frame body 40 has an opening that corresponds to the electronic device 10. The electronic device 10 is fixed to the base body 20. The lid body 30 is fixed to the base body 20 through the frame body 40. The lid body 30 faces the electronic device 10 through an inner space 60. The frame body 40 encloses the inner space 60 between the lid body 30 and the electronic device 10. In other words, the inner space 60 is formed in the opening of the frame body 40.

The positional relationship among members that form the electronic component 100 can be explained on the basis of a reference plane relating to the position of the electronic device 10. The reference plane is an imaginary plane that is located between a front surface 101 of the electronic device 10 and a back surface 102 of the electronic device 10 and penetrates through an outer edge 105 of the electronic device 10. The front surface 101 is located at one side of the reference plane (the side of the front surface), and the back surface 102 is located at the other side of the reference plane (the side of the back surface). The reference plane is a plane along the X-Y direction, and the Z direction is a direction perpendicular to the reference plane. If the electronic device 10 is a semiconductor device, the reference plane may be set at the interface between a semiconductor layer and an insulator layer for convenience of arrangement. The X direction and Y direction are typically parallel to a front surface 101 of the electronic device 10 facing the lid body 30, a back surface 102 of the electronic device 10 being an opposite surface opposite to the front surface 101 and being fixed to the base body 20, an outer surface 301 of the lid body 30, and an inner surface 302 of the lid body 30. Also, the Z direction is perpendicular to the front surface 101, the back surface 102, the outer surface 301, and the inner surface 302. The electronic device 10 and the electronic component 100 typically have rectangular shapes in the X direction and Y direction. Also, the dimensions in the Z direction are smaller than the dimensions in the X direction and Y direction. Hence, the electronic device 10 and the electronic component 100 have substantially flat plate shapes. Hereinafter, a dimension in the Z direction is called thickness or height for convenience of description. Here, an orthogonal projection region is described. An orthogonal projection region of a certain member is a region in which the member can be projected in the Z direction perpendicular to the reference plane. A situation in which another member different from the certain member is located in the orthogonal projection region of the certain member represents that the certain member overlaps the other member in the Z direction. That is, if the other member is located within the orthogonal projection region of the certain member, it can be said that the other member is located in a region in which the other member overlaps the certain member in the Z direction. In contrast, if the other member is located outside the orthogonal projection region of the certain member, it can be said that at least part of the other member is located in a region in which the at least part of the other member does not overlap the certain member. The boundary between the inside and outside of an orthogonal projection region corresponds to the outer edge or inner edge (inner edge may not be present) that is the outline of a subject member. For example, the lid body 30 that faces the electronic device 10 is located in an orthogonal projection region of the electronic device 10, i.e., a region in which the lid body 30 overlaps the electronic device 10 in the Z direction.

In the X direction and Y direction, an outer edge of the electronic component 100 is determined by an outer edge 205 of the base body 20, an outer edge 405 of the frame body 40, and an outer edge 305 of the lid body 30. The frame body 40 has an inner edge 403 in addition to the outer edge 405. The opening of the frame body 40 is determined by the inner edge 403.

The type of the electronic device 10 is not particularly limited; however, is typically an optical device. The electronic device 10 of this example includes a main part 1 and a sub-part 2. The main part 1 is typically located at the center of the electronic device 10, and the sub-part 2 is typically located in the periphery of the main part 1. If the electronic device 10 is an image pickup device, such as a charge-coupled device (CCD) image sensor or a complementary metal-oxide semiconductor (CMOS) image sensor, the main part 1 is an image pickup region. If the electronic device 10 is a display device, such as a liquid crystal display or an electroluminescence (EL) display, the main part 1 is a display region. In the case of the image pickup device, the front surface 101 being a facing surface of the electronic device 10 facing the lid body 30 serves as a light incidence surface. This light incidence surface may be formed by a top layer of a multi-layer film provided on a semiconductor substrate having a light receiving surface. The multi-layer film includes layers having optical functions, such as a color filter layer, a microlens layer, an antireflection layer, and a light shielding layer; a layer having a mechanical function such as a planarizing layer; and a layer having a chemical function such as a passivation layer. The sub-part 2 has a driving circuit that drives the main part 1, and a signal processing circuit that processes a signal from the main part 1 (or a signal to the main part 1). If the electronic device 10 is a semiconductor device, such circuits are easily formed in a monolithic manner. The sub-part 2 has electrodes 3 (electrode pads) that allow the electronic device 10 to exchange signals with an external device.

At least part of a center region of the base body 20 is an arrangement region 210. The electronic device 10 is arranged on the arrangement region 210. The electronic device 10 is fixed to the base body 20. As shown in FIGS. 2A and 2B, the electronic device 10 is typically fixed through a jointing material 52 that is arranged between the arrangement region 210 of the base body 20 and the back surface 102 of the electronic device 10. Alternatively, the jointing material 52 may contact only an outer edge 105 that is a side surface of the electronic device 10 and the jointing material 52 may not be provided between the arrangement region 210 of the base body 20 and the back surface 102 of the electronic device 10. The jointing material 52 may be a conductive or insulating material. Also, the jointing material 52 desirably has high thermal conductance, and may contain metal particles.

The package 50 includes an inner terminal 5 facing the inside (the inner space 60) of the package 50 and an outer terminal 7 facing the outside of the package 50. The inner terminal 5 and the outer terminal 7 are integrally provided with the base body 20. A plurality of the inner terminals 5 are arrayed and form an inner terminal group. In this example, as shown in FIG. 1A, an inner terminal group includes ten inner terminals 5 arrayed in a line along the X direction, and two such lines (two groups) of the inner terminal groups are provided in the Y direction. The arrangement of the inner terminals 5 is not limited to the above-described arrangement, and an inner terminal group may include inner terminals arrayed in a line along the Y direction, and two such lines of the inner terminal groups may be provided in the X direction. Also, two lines of inner terminal groups each including inner terminals 5 arrayed in a line along the Y direction, and two lines of inner terminal groups each including inner terminals 5 arrayed in a line along the X direction may be provided to surround the electronic device 10. Also, a plurality of the outer terminals 7 form an outer terminal group. In this example, as shown in FIG. 1B, the outer terminal group including the outer terminals arrayed in rows and columns along the X direction and Y direction is provided on a back surface 206 of the base body 20, the back surface 206 forming the back side of the electronic component 100. The arrangement of the outer terminals 7 is not limited to the above-described arrangement. Outer terminal groups may be arranged in lines in the X direction and/or Y direction along the outer edge 205 that is the side surface of the base body 20.

The inner terminals 5 and the outer terminals 7 are electrically continued through an embedded part 6 that is embedded as inner wiring in the base body 20. The electrodes 3 of the electronic device 10 and the inner terminals 5 of the package 50, which form the electronic component 100, are electrically connected through connection conductors 4. In this example, the electrodes 3 are connected with the inner terminals 5 by wire bonding connection, and the connection conductors 4 are metal wires (bonding wires). Alternatively, the electrodes 3 may be connected with the inner terminals 5 by flip-chip connection. In this case, the electrodes 3 are provided on the back surface 102 of the electronic device 10, and the inner terminals 5 and the connection conductors 4 are located in the arrangement region 210. In this example, the form of the outer terminals 7 is a land grid array (LGA). Alternatively, the form may be a pin grid array (PGA), a ball grid array (BGA), or a leadless chip carrier (LCC). With such a form, the plurality of outer terminals 7 may be located in an orthogonal projection region of the lid body 30 on the base body 20. And, the plurality of outer terminals 7 may be located in an orthogonal projection region of the base body 20, and positioned inside of the outer edge 205 of the base body. Part of the plurality of outer terminals 7 may be located in an orthogonal projection region of the electronic device 10 on the base body 20. In this way, the plurality of outer terminals 7 may be arranged in a region where the outer terminals 7 overlap at least one of the electronic device 10, the base body 20 and the lid body 30 in the Z direction. The inner terminals 5, the embedded part 6, and the outer terminals 7 may be integrated by using a leadframe. In this case, the inner terminals 5 serve as an inner lead, and the outer terminals 7 serve as an outer lead. With the form using the leadframe, the plurality of outer terminals 7 are located outside an orthogonal projection region of the lid body 30 on the base body 20. The outer terminals 7 of the electronic component 100 are electrically connected with connection terminals of a wiring member of, for example, a printed wiring board, and at the same time are fixed to the wiring member. The outer terminals 7 located in the orthogonal projection region of the lid body 30 on the base body 20 may be electrically connected with an external circuit by reflow soldering with use of solder paste. In this way, the electronic component 100 is second-mounted on the wiring member and hence forms an electronic module. The electronic module may be also used as an electronic component. The mounting form is desirably surface mounting. By installing the electronic module in a housing, an electronic apparatus is formed.

The base body 20 has a concave shape. More specifically, a center region of a plate-shaped part forms a bottom part of a concave shape, and a frame-shaped part provided on a peripheral region of the plate-shaped part forms a side part of the concave shape. The base body 20 may be integrally formed by stacking a plate member and a frame member. Alternatively, the base body 20 may be integrally formed by, for example, die molding or cutting. The base body 20 may be a conductor such as a metal sheet as long as insulation of the inner terminals 5 and the outer terminals 7 is ensured. The base body 20, however, is typically formed of an insulator. Although the base body 20 may be a flexible substrate such as a polyimide substrate, the base body 20 is desirably a rigid substrate, such as a glass epoxy substrate, a composite substrate, a glass composite substrate, a Bakelite substrate, or a ceramic substrate. In particular, the ceramic substrate is desirable, and the base body 20 is desirably a laminated ceramic. The ceramic material may be silicon carbide, aluminum nitride, sapphire, alumina, silicon nitride, cermet, yttria, mullite, forsterite, cordierite, zirconia, or steatite.

As shown in FIGS. 2A and 2B, the peripheral region of the base body 20 having the concave shape includes a stage part and a step part. The stage part is a part that extends in the X direction and Y direction. The step part is located between two stage parts at different heights in the Z direction, and extends in the Z direction.

The stage part provided with the inner terminals 5 is determined as a fiducial stage part 202. In this embodiment, as shown in FIGS. 2A and 2B, an upper stage part 204 is located at the side of the outer edge of the package 50 with respect to the inner terminal groups in the Y direction, that is, at the side of the outer edge 205 of the base body 20. The upper stage part 204 protrudes with respect to the fiducial stage part 202. That is, the upper stage part 204 is located at the side of the lid body 30 with respect to the fiducial stage part 202 in the Z direction. A step part 203 is located between the fiducial stage part 202 and the upper stage part 204. The step part 203 faces the connection conductors 4 through part of the inner space 60.

Also, in the example shown in FIGS. 2A and 2B, the base body 20 includes a lower stage part 200 in addition to the fiducial stage part 202 and the upper stage part 204. The lower stage part 200 is located at a position farther from the outer edge 205 of the base body 20 than the position of the inner terminal groups. That is, the lower stage part 200 is located at the inner side of the base body 20 than the positions of the inner terminal groups. The lower stage part 200 is recessed with respect to the fiducial stage part 202 through a step part 201. That is, the lower stage part 200 is located at a position farther from the lid body 30 than the positions of the inner terminal groups through the step part 201 in the Z direction. The step part 201 faces the outer edge 105 of the electronic device 10 through part of the inner space 60. The fiducial stage part 202 is located between the upper stage part 204 and the lower stage part 200. Hence, the fiducial stage part 202 may be called middle stage part. As shown in FIG. 2B, the fiducial stage part 202 is not provided between the lower stage part 200 and the upper stage part 204 in the X direction along which the inner terminals 5 are not provided. The step part 203 is located between the upper stage part 204 and the lower stage part 200. A middle stage part may be provided between the upper stage part 204 and the lower stage part 200 in the X direction like the middle stage part provided in the Y direction. However, such a middle stage part not provided with the inner terminals 5 may result in a needless increase in size of the package 50. Desirably, such a middle stage part is not provided.

Next, a modification of the electronic component 100 is described with reference to FIGS. 3A and 3B. In the modification shown in FIGS. 3A and 3B, the base body 20 has a flat plate shape without a stage part or a step part. Hence, in this example, a fiducial stage part in FIGS. 3A and 3B may be also called fiducial surface. The electronic device 10 and the frame body 40 are fixed to the surface of the fiducial stage part 202 on which the inner terminals 5 are arranged. The lower stage part 200 or the upper stage part 204 as shown in FIGS. 2A and 2B is not provided. Consequently, the frame body 40 encloses not only the inner space 60 but also the electronic device 10. Alternatively, by decreasing the distance between the electronic device 10 and the lid body 30, or by providing a frame part at the lid body 30, the frame body 40 may not enclose the inner space 60 but may enclose only the electronic device 10. That is, the frame body 40 may enclose at lease one of the inner space 60 and the electronic device 10. Other points are similar to those of the electronic component 100 shown in FIGS. 2A and 2B. Also, through not shown, as a two-stage structure including an upper stage part and a lower stage part, the frame body 40 may be fixed to the upper stage part, the electronic device 10 may be arranged at the lower stage part, and the inner terminals 5 may be arranged at the lower stage part.

The lid body 30 that faces the electronic device 10 has a function of protecting the electronic device 10. If the electronic device 10 is an image pickup device or a display device that uses light, the lid body 30 is required to be transparent to the light (typically, visible light). A suitable material for such a lid body 30 is, for example, plastic, glass, or quartz crystal. A surface of the lid body 30 may have antireflection coating or infrared cut coating.

As it is understood from FIG. 4, the electronic component 100 is formed by stacking the prepared electronic device 10, base body 20, lid body 30, and frame body 40 in the Z direction. In FIG. 4, long broken lines indicate the relationship between the base body 20 and the frame body 40, single-dot chain lines indicate the relationship between the electronic device 10 and the base body 20, and double-dot chain lines indicate the relationship between the frame body 40 and the lid body 30. Also, broken lines indicate the outline of the lid body 30 on the frame body 40, the outline of the electronic device 10 on the base body 20, and the outline of the frame body 40 on the base body 20.

The lid body 30 is fixed to the base body 20 through the frame body 40. More specifically, as shown in FIGS. 2A and 2B, the frame body 40 and the base body 20 are bonded to each other through a jointing material 51. Also, as shown in FIGS. 2A and 2B, the frame body 40 and the lid body 30 are bonded to each other through a jointing material 53. In this embodiment, the lid body 30 is located at the position farther from the electronic device 10 and the base body 20 than the position of the frame body 40 in the Z direction, and the jointing material 53 is provided on the inner surface 302 of the lid body 30, the inner surface 302 being a facing surface of the lid body 30 facing the electronic device 10. Alternatively, like a form in FIG. 3 of Japanese Patent Laid-Open No. 2003-101042, part of the frame body 40 may be located at a position farther from the electronic device 10 and the base body 20 than the position of the lid body 30 in the Z direction, and the jointing material 53 may be provided on the outer surface 301 of the lid body 30. The jointing materials 51, 52, and 53 have thicknesses in a range from 1 to 1000 µm, or typically in a range from 10 to 100 µm.

More specifically, the frame body 40 and the base body 20 are bonded with use of an adhesive, the electronic device 10 and the base body 20 are bonded with use of an adhesive, and the lid body 30 and the frame body 40 are bonded with use of an adhesive. The order of bonding these parts is not particularly limited. However, it is desirable that the frame body 40 and the base body 20 are bonded before the lid body 30 and the frame body 40 are bonded. Also, it is desirable that the frame body 40 and the base body 20 are bonded before the electronic device 10 and the base body 20 are bonded. That is, the frame body 40 and the base body 20 are bonded first, and hence the mounting member having an arrangement region on which an electronic device is to be disposed is formed. The electronic device 10 is fixed to the mounting member. Then, the lid body 30 is bonded to the mounting member on the arrangement region.

The base body 20 and the frame body 40 are bonded by the jointing material 51 desirably at the entire circumferences of their joint surfaces. Also, the lid body 30 and the frame body 40 are bonded by the jointing material 53 desirably at the entire circumferences of their joint surfaces. As described above, the entire circumferences serve as bonding regions, so that the inner space 60 around the electronic device 10 becomes hermetically sealed from the outside air. Accordingly, a foreign substance is prevented from entering the inner space 60, and reliability is increased. To ensure hermeticity, the adhesive may be used by a sufficient amount.

The above-described jointing materials 51, 52, and 53 are formed by solidifying the applied adhesives. The type of adhesive may be, for example, drying solidification type through evaporation of a solvent, chemical reaction type by hardening through polymerization of molecules with light or heat, or thermal fusion (hot-melt) type by solidifying through setting of a molten adhesive. A typical adhesive may be a photo-curable resin that is hardened with an ultraviolet ray or visible light, or a thermosetting resin that is hardened with heat. The thermosetting resin is suitably used for the adhesives of the jointing material 51 and the jointing material 52. The photo-curable resin is suitably used for the adhesive of the jointing material 53.

The frame body 40 includes a joint surface 401 that faces the base body 20 and is bonded to the jointing material 51, and a joint surface 402 that faces the lid body 30 and is bonded to the jointing material 53. The frame body 40 is provided to enclose the inner space 60 between the electronic device 10 and the lid body 30. A surface of the frame body 40, the surface which faces the inner space 60 and encloses the inner space 60, is the inner edge 403. The frame body 40 in this example, in which the outer edge 405 of the frame body 40 is exposed to the outer space, has an extension part 404 that extends in the X direction from between the base body 20 and the lid body 30 to the outer space. The extension part 404 has a through hole 406. The through hole 406 is used for a screwing hole for fixture to a housing or the like of an electronic apparatus, or is used for a positioning hole.

To enhance the hermeticity of the inner space 60, the frame body 40 desirably continuously encloses the inner space 60 without a break. Also, to ensure the rigidity of the frame body 40 and further the rigidity of the electronic component 100, the frame body 40 is desirably a closed loop without a break. Also, to ensure thermal conductance (described later), the frame body 40 is desirably a closed loop that is continuous in the circumferential direction. However, if limitation is provided in manufacturing, the frame body 40 may be divided into a plurality of sections on a side basis and may be arranged. Alternatively, the frame body 40 may have slits to allow the inner space 60 to communicate with the outer space. If the frame body 40 has breaks in this way, discontinuous portions (slits) generated in the frame body 40 are desirably as few as possible. More specifically, the total length of the discontinuous portions is desirably less than 10% of the length of the circumference that encloses the inner space 60 and the electronic device 10. In other words, if the frame body 40 is present by a length in total that is 90% or more of the length of the circumference along the circumference of the inner space 60 and the electronic device 10, it can be assumed that the frame body 40 encloses the inner space 60 and the electronic device 10.

The material of the frame body 40 is not particularly limited, and may properly use resin, ceramic, or metal. The metal mentioned here includes not only a metal of one kind, but also an alloy of metals. Since an adhesive is used in this embodiment, this embodiment is suitable when the material of the frame body 40 is different from the material of the base body 20. Also, this embodiment is suitable when the material of the frame body 40 is different from the material of the lid body 30. An example of such a case is when the material of the base body 20 is ceramic, the material of the lid body 30 is glass, and the material of the frame body 40 is metal or resin.

If the frame body 40 has high thermal conductance, the frame body 40 can be used as a heat spreader, and heat of the electronic device 10 can be radiated through the extension part 404. For heat radiation, the thermal conductivity of the frame body 40 is preferably 1.0 W/m·K or higher, or more preferably 10 W/m·K or higher. A thermal conductivity of resin is typically lower than 1.0 W/m·K. In particular, in a form (LGA etc.) in which the outer terminals 7 are provided on the back surface 206 of the base body 20 like this example, or in a form (LCC) in which outer terminals are provided on a side surface (the outer edge 205) of the base body 20, the frame body 40 is suitably used as a heat conductor. This is because, since the back surface 206 of the base body 20 is likely connected with a wiring member (glass epoxy substrate, polyimide substrate, etc.) with a relatively low thermal conductivity, heat radiation performance from the side of the back surface 206 of the base body 20 is decreased.

Also, to reduce a stress that is generated on the electronic component 100, the frame body 40 desirably has a thermal expansion coefficient (linear expansion coefficient) being as low as possible. More specifically, the thermal expansion coefficient of the frame body 40 is desirably 50 ppm/K or smaller. A thermal expansion coefficient of resin is typically larger than 50 ppm/K.

In the viewpoint of the thermal conduction and thermal expansion, the material of the frame body 40 is desirably metal. A typical material may be aluminum, an aluminum alloy, copper, a copper alloy, iron, an iron alloy, etc. The material is desirably an iron alloy, such as stainless steel, or other iron alloy containing chromium, nickel, or cobalt. For example, SUS430 that is a ferritic stainless steel, SUS304 that is an austenitic stainless steel, 42 alloy, Kovar, etc., may be used.

The frame body 40 has a function of determining a gap between the electronic device 10 and the lid body 30, and a function of supporting the lid body 30. Also, the frame body 40 has a function as a heat radiating member since the frame body 40 has the above-described screwing hole or positioning hole and has high thermal conductance. Hence, the base body 20 and the frame body 40 may be collectively called mounting member.

This embodiment is described below in more detail mainly with reference to FIGS. 5A and 5B.

Figure 5A:
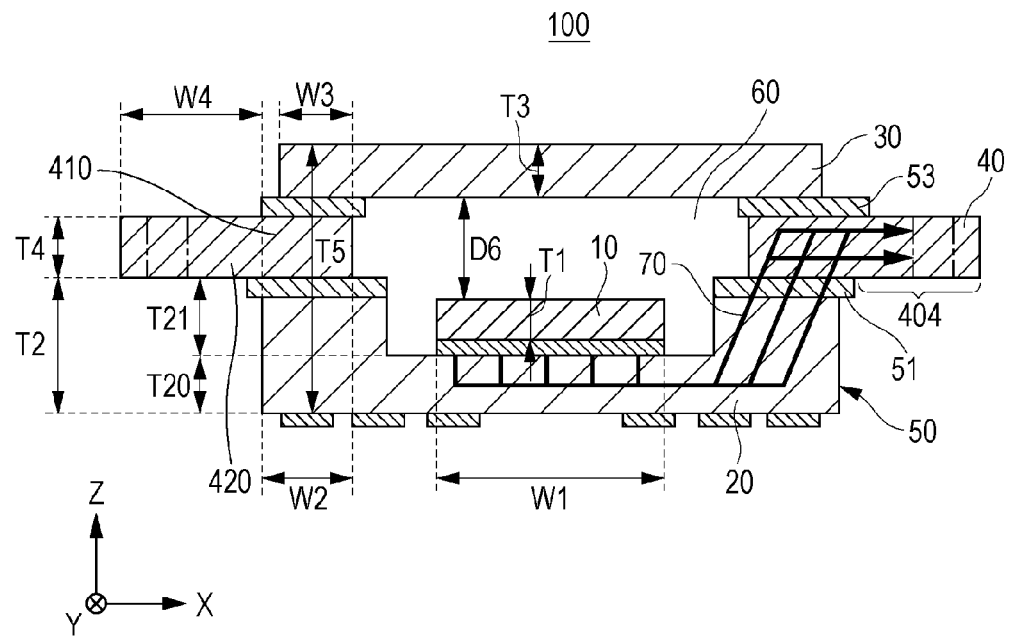
FIGS. 5A and 5B are schematic sectional views of the example of the electronic component.
Figure 5B:
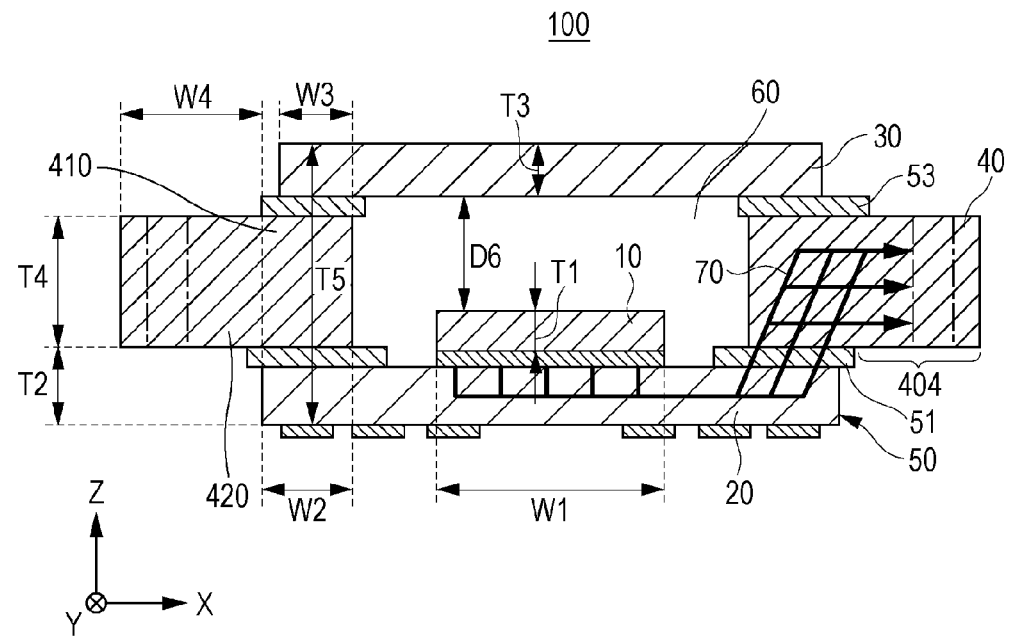

FIG. 5A is a sectional view taken along a line similar to that of FIG. 2B, and FIG. 5B is a sectional view taken along a line similar to that of FIG. 3B. These figures show dimensions of respective members.

W1 indicates an outer diameter of the electronic device 10 in the X direction. W2 indicates a length of a portion (first portion 410) of the frame body 40 in the X direction, the portion being located at the side of the inner edge 403 of the frame body 40 with respect to the outer edge 205 of the base body 20. W3 indicates a length of a portion of the frame body 40 in the X direction, the portion being located at the side of the inner edge 403 of the frame body 40 with respect to the outer edge 305 of the lid body 30. The first portion 410 is a portion of the frame body 40 to be bonded to the base body 20. In the example in FIG. 5A, as shown in FIG. 2B, a surface of the first portion 410 is a region that faces the base body 20 (in this case, the upper stage part 204) at the joint surface 401 of the frame body 40. Also, W4 indicates a length of a portion (second portion 420) of the frame body 40 in the X direction, the portion being located at the side of the outer edge 405 of the frame body 40 with respect to the outer edge 205 of the base body 20. In the example in FIG. 5A, as shown in FIG. 2B, a surface of the second portion 420 is a region that does not face the base body 20 (in this case, the upper stage part 204) at the joint surface 401 of the frame body 40. T3 indicates a thickness of the lid body 30, and T4 indicates a thickness of the frame body 40. In this example, the thickness T4 of the frame body 40 is substantially equivalent to a distance between a peripheral region of the base body 20 and a peripheral region of the lid body 30, because the thicknesses of the jointing materials 51 and 53 are substantially negligible. In this embodiment, the thickness T4 of the frame body 40 is smaller than the length W2 of the first portion 410. That is, in this example, a section of a portion of the frame body 40 located on the base body 20 has a rectangular shape in which the X direction is the long-side direction and the Z direction is the short-side direction. In this case, the first portion 410 and the second portion 420 have equivalent thicknesses, and the thickness T4 of the frame body 40 indicates not only the thickness of the first portion 410 but also the thickness of the second portion 420. However, as long as the thickness of the first portion 410 is smaller than the length W2 of the first portion 410, the thickness of the second portion 420 may be larger or smaller than the thickness of the first portion 410. To increase the thermal conductance of the second portion 420, the thickness of the second portion 420 is desirably larger than the thickness of the first portion 410. Accordingly, efficiency of thermal conduction by the frame body 40 can be increased while an increase of a thickness T5 of the electronic component 100 is restricted. The thickness T5 of the electronic component 100 is substantially equal to a total of the thickness T2, the thickness T4 and the thickness T3. In this example, the thickness T3 of the lid body 30 may be smaller than the length W3. FIGS. 5A and 5B show a conduction path 70 for heat that is generated at the electronic device 10. FIGS. 5A and 5B show only the conduction path 70 in the right half section; however, the conduction path 70 is similarly provided in the left half section. Since W2>T4, thermal resistance values of the base body 20 and the frame body 40 are decreased, and also, heat can be efficiently conducted from the first portion 410 to the second portion 420.

A desirable form for the two parameters W2 and T4 relating to the frame body 40 as a member for thermal conduction as described above is that the thermal conductivity of the frame body 40 is high and is higher than the thermal conductivity of the base body 20. Accordingly, the thickness of the frame body 40 can be decreased to a range in which rigidity can be maintained. The thickness of the electronic component 100 can be further decreased. Also, for the thickness T4 of the frame body 40, it is desirable to meet T4<W2. Since T4<W2, the thermal resistance between the frame body 40 and the base body 20 can be decreased, and the reliability of the electronic component can be ensured.

In this embodiment, as described with reference to FIGS. 1A and 1B, extension parts 404 are provided at both sides of the electronic device 10 in the X direction. Hence, the width W4 of the second portion 420 of the frame body 40 is larger than the width W2 of the first portion 410 located between the extension part 404 and the inner edge 403 in the X direction. Accordingly, the second portion 420 can efficiently radiate heat.

The width W4 of the second portion 420 of the frame body 40 is a portion that is connected with a housing etc. of an electronic apparatus, and the connection method may be various methods including using an adhesive and screwing. Hence, the width W4 of the second portion 420 is desirably larger than the width W2 of the first portion 410. Since W4>W2, the thermal resistance of a connection region portion with W4 connected with the housing etc. can be decreased as compared with the region with W2. Thus, the heat radiation performance can be increased. In contrast, if W4<W2, the thermal resistance of the connection region portion of the second portion 420 connected with the housing etc. is increased, and consequently, the temperature of the first portion 410 is also increased. Since the jointing material 51 and the jointing material 53 are applied to the first portion 410, if the temperature is increased, deterioration in these jointing materials may be accelerated.

Also, in this embodiment, the thickness T4 of the frame body 40 is smaller than a distance D6 between the lid body 30 and the electronic device 10 (the distance between the inner surface 302 and the front surface 101); however, the thickness T4 may be larger than the distance D6. In the electronic component 100, the distance D6 for ensuring the inner space 60 requires a constant amount. In this embodiment, since the frame body 40 is provided to enclose the inner space 60, an increase in thickness T5 of the electronic component 100 due to the frame body 40 can be restricted. In contrast, in a structure of related art, in which a heat radiating plate is embedded in the base body 20, the thickness of the base body 20 is increased by an amount of the heat radiating plate. That is, in this embodiment, since the distance D6 also serves as the thickness T4 of the frame body 40, an increase in thickness of the electronic component 100 can be restricted. In FIG. 5A, a thickness T2 of the base body 20 is indicated. The thickness T2 is a thickness of the peripheral region of the base body 20. The thickness T2 is substantially equal to total of a thickness T20 of the plate-shaped part, which forms the bottom part of the concave shape, and a thickness T21 of the frame-shaped part, which forms the side part of the concave shape. The thickness T2 of the base body 20 is increased by an amount of a thickness T21 of a frame member that forms the step part 203. If the thermal conductivity of the base body 20 is lower than the thermal conductivity of the frame body 40, T21 may be as small as possible. It is desirable to meet T21<T1. In this case, the frame body 40 encloses the electronic device 10. In this case, a thickness T1 of the electronic device 10 also serves as at least part of the thickness T4 of the frame body 40, and hence an increase in thickness of the electronic component 100 can be restricted. As descried above, since the frame body 40 that is arranged to enclose at least one of the inner space 60 and the electronic device 10 is used as the thermal conductor, the heat radiation performance of the electronic component 100 can be increased while an increase in the thickness T5 of the electronic component 100 is restricted.

The lid body 30 is bonded to the first portion 410 of the frame body 40. Hence, the thermal conductivity of the lid body 30 is desirably lower than the thermal conductivity of the frame body 40. If the thermal conductivity of the lid body 30 is low, the heat conducted from the base body 20 is likely conducted from the first portion 410 to the second portion 420 rather than conduction from the first portion 410 to the lid body. Hence, the efficiency of the heat radiation at the second portion 420 is increased. Of course, the thermal conductivities of the base body 20 and the frame body 40 are desirably high, and are desirably higher than the thermal conductivity of the lid body 30. Also, the thermal conductivity of the frame body 40 is desirably higher than the thermal conductivity of the base body 20. For practical use, the thermal conductivities of the base body 20 and the frame body 40 are preferably 2.0 W/m·K or higher, or more preferably, 10 W/m·K or higher.

To decrease the thermal resistance of the frame body 40 and to ensure the thermal conductance, the thickness T4 of the frame body 40 has to be a certain value or larger, and in practical use, the thickness T4 may be 0.1 mm or larger. If the frame body 40 is a component that is connected with a housing etc. of an electronic apparatus, the frame body 40 desirably has a sufficient rigidity. If the frame body 40 has the rigidity, the frame body 40 can have a positioning function and a function as a support body. In such a point of view, the thickness T4 of the frame body 40 may be typically in a range from 0.2 to 2.0 mm, although the thickness depends on the material of the frame body 40. If the thermal conductivity of the frame body 40 is 10 W/m·K or higher, the thickness T4 of the frame body 40 is preferably in a range from 0.4 to 1.6 mm, or more preferably, in a range from 0.5 to 1.2 mm.

The first portion 410 is a portion at which the frame body 40 and the base body 20 are bonded by the jointing material 51, and is a main portion that determines a thermal resistance in a heat path extending from the base body 20 to the second portion 420. If the length W2 of the first portion 410 is extremely small, the thermal conduction from the base body 20 to the first portion 410 is low. The jointing material 51 interposed between the base body 20 and the first portion 410 may be a factor of an increase in thermal resistance between the base body 20 and the first portion 410. If the length W2 of the first portion 410 is extremely small, the adhesive force between the base body 20 and the frame body 40 is small. The reliability and heat resistance of the mounting member or the electronic component may be decreased. Hence, the length W2 of the first portion 410 has to be a certain value or larger. If the length W2 of the first portion 410 is extremely large, the distance to the second portion 420 is increased and the thermal resistance is increased. Also, the mounting member or the electronic component is unnecessarily increased in size. In such a point of view, the length W2 of the first portion 410 of the frame body 40 may be typically in a range from 0.5 to 5.0 mm, although the length depends on the material of the frame body 40. If the thermal conductivity of the frame body 40 is 10 W/m·K or higher, the length W2 of the first portion 410 is preferably in a range from 1.0 to 4.0 mm, or more preferably, in a range from 1.5 to 2.5 mm. The length W4 of the second portion 420 is not particularly limited; however, the length W4 is desirably in a range from 1.0 to 10 mm.

The inner space 60 is located between the step part 201, which is provided between the upper stage part 204 and the lower stage part 200, and the outer edge 105 of the electronic device 10 as shown in FIG. 2B. The thermal conductance between the step part 201 and the outer edge 105 may be increased. More specifically, a thermally conductive member may be provided between the step part 201 and the outer edge 105 of the electronic device 10 to contact the step part 201 and the outer edge 105. Accordingly, the inner space 60 between the electronic device 10 and the outer edge 105 can be filled. In this case, the thermal conductivity of the thermally conductive member is preferably 1.0 W/m·K or higher, or more preferably 10 W/m·K or higher. Also, the thermally conductive member desirably has a higher thermal conductivity than the thermal conductivity of the base body 20. As described above, since the thermally conductive member with the higher thermal conductance than that of the base body 20 is used, the thermal conductance of the package 50 can be increased. A thermally and electrically conductive member may be a member formed by solidifying electrically conductive paste, such as silver paste or copper paste. The silver paste has an electrical conductivity in a range from $1\times10^{-4}$ to $1\times10^{-5}$ Ωcm. If the inner terminals 5 or the connection conductors 4 are located between the outer edge 105 of the electronic device 10 and the step part 201, it may be difficult to use such electrically conductive paste because insulation has to be provided. However, in this embodiment, since the inner terminals 5 are arranged on the fiducial stage part 202 as described with reference to FIG. 2A, such electrically conductive paste can be easily used.

Also, if the thermally conductive member is provided in a region that is within the orthogonal projection region of the electronic device 10 (a region superposed on the electronic device 10 in the Z direction) and that is the opposite side of the lid body 30 (the side of the base body 20) with respect to the electronic device 10, the heat radiation performance of the heat from the electronic device 10 is further increased. Further, if the thermally conductive member extends to the outside of the orthogonal projection region of the electronic device 10, the heat radiation performance is further increased. Further, if the thermally conductive member extends to the inside of the orthogonal projection region of the frame body 40 (a region superposed on the frame body 40 in the Z direction), the heat radiation performance is further increased.

For example, the jointing material 52 located between the electronic device 10 and the base body 20 may be formed by solidifying the above-described electrically conductive paste and may serve as the thermally conductive jointing material 52 (the thermally conductive member). Accordingly, the thermal conductance between the electronic device 10 and the base body 20 is increased and the heat radiation performance is also increased. If such a thermally conductive jointing material 52 is provided to further extend onto a region outside the orthogonal projection region of the electronic device 10, or a region outside the arrangement region 210 of the lower stage part 200 of the base body 20, the contact area between the thermally conductive jointing material 52 and the base body 20 is increased, and the heat radiation can be further increased. Further, if the thermally conductive jointing material 52 is provided to extend to contact the step part 201 of the base body 20 as described above, the heat radiation performance can be further increased.

Figure 6A:
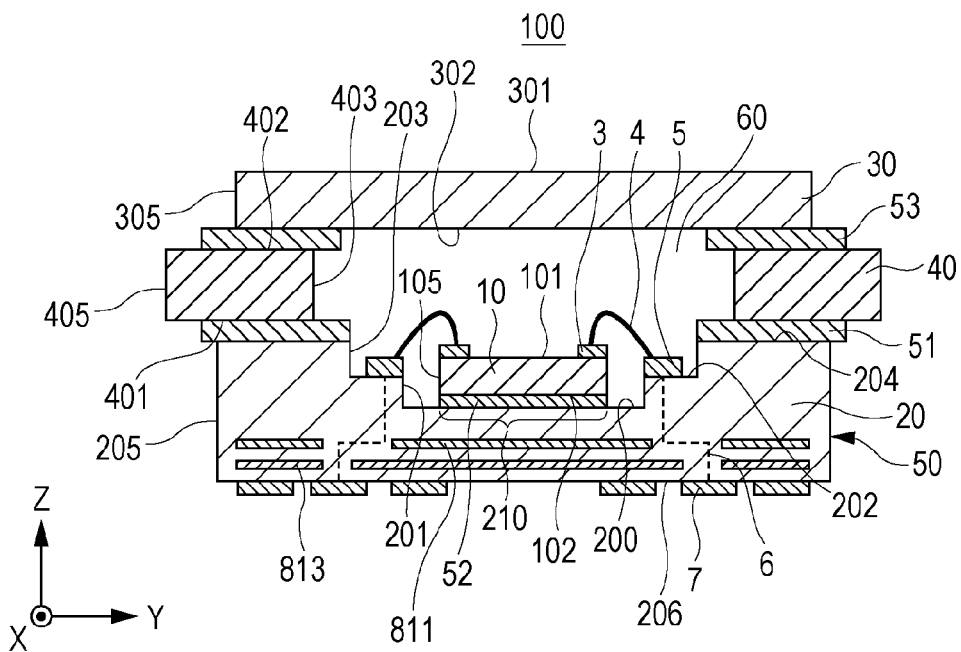
FIGS. 6A and 6B are schematic sectional views of an example of an electronic component.
Figure 6B:
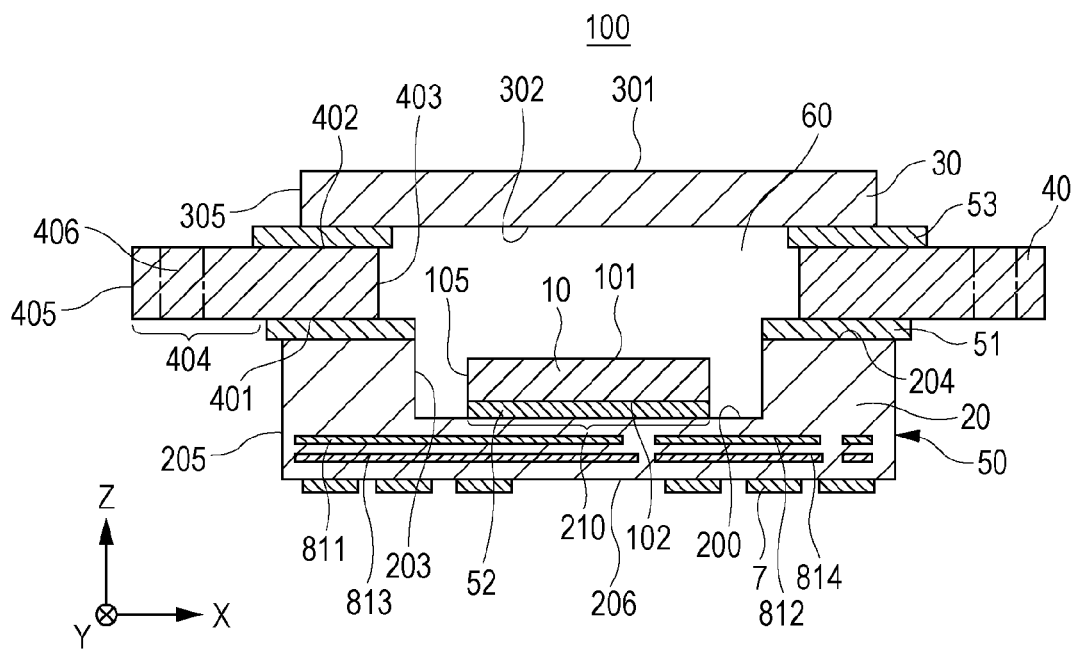
Figure 7A:
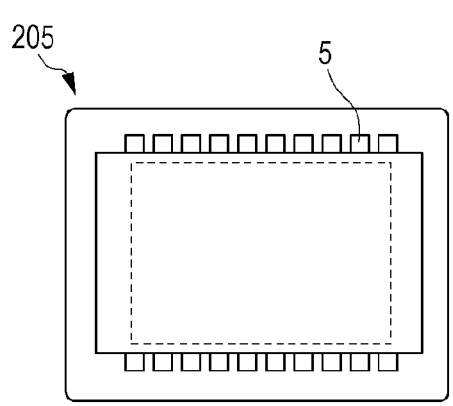
FIGS. 7A to 7D are schematic plan views of the example of the electronic component.
Figure 7B:
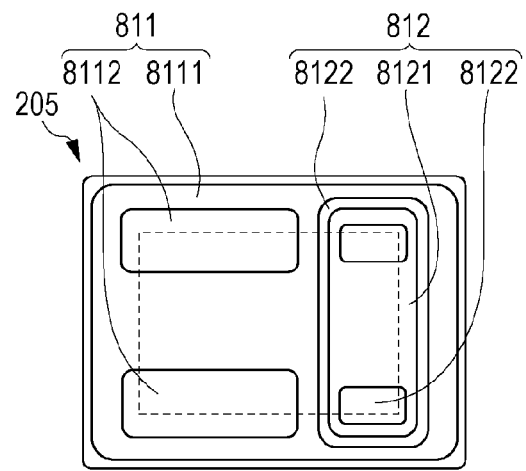
Figure 7C:
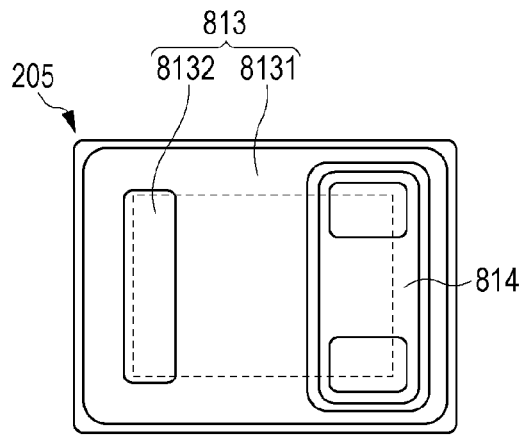
Figure 7D:
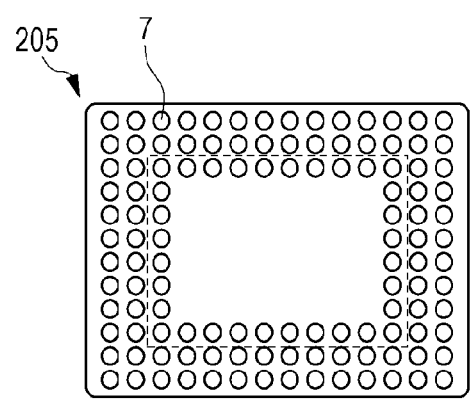

FIGS. 6A and 6B show a modification corresponding to the sections in FIGS. 2A and 2B. The modification is a form in which a film (a thermally conductive film) serving as the thermally conductive member is embedded in the base body 20, so that the thermal conductance and heat radiation performance of the base body 20 are increased. In the example of FIGS. 6A and 6B, thermally conductive films having higher thermal conductivities than that of the base body 20 are provided at two levels between the back surface 206 of the base body 20 and the surface of the lower stage part 200 of the base body 20. FIG. 7A is a plan view of the upper stage part of the base body 20 on which the inner terminals 5 are arrayed. FIG. 7B is a plan view at a first level in the base body 20. FIG. 7C is a plan view at a second level in the base body 20. FIG. 7D is a plan view of the back surface of the base body 20 on which the outer terminals 7 are arrayed.

A first thermally conductive film 811 and a second thermally conductive film 812 are located at the first level at equidistance from the electronic device 10. A third thermally conductive film 813 and a fourth thermally conductive film 814 are located at the second level at equidistance from the electronic device 10, the second level being located at a position farther from the electronic device 10 than the position of the first level. That is, the first thermally conductive film 811 and the second thermally conductive film 812 are arranged at positions closer to the electronic device 10 than the positions of the third thermally conductive film 813 and the fourth thermally conductive film 814. In this case, the two thermally conductive films are used as thermally conductive films at equidistance from the electronic device 10; however, only a single thermally conductive film may be used, or three or more thermally conductive films may be used. The total area of a plurality of thermally conductive films at equidistance from the electronic device 10 desirably extends at least ½ of the area of the orthogonal projection region of the electronic device 10 (equivalent to the area of the electronic device 10).

As it is understood from FIGS. 6A and 6B, and FIGS. 7A to 7D, any of the first to fourth thermally conductive films are located within the orthogonal projection region of the electronic device 10. Further, any of the first to fourth thermally conductive films extends to the outside of the orthogonal projection region of the electronic device 10, and to the inside of the orthogonal projection region of the frame body 40. FIGS. 7A to 7D indicate the dimensions of the electronic device 10 by dotted lines. As it is understood from FIGS. 7A to 7D, the respective thermally conductive films 811, 812, 813, and 814 are present only within the orthogonal projection region of the base body 20 (inside the outer edge 205 of the base body 20), but are not present outside the orthogonal projection region of the base body 20. Each of the respective thermally conductive films has a single continuous sheet-shaped structure. The sheet-shaped structure may have a hole, a slit, etc., to form a via or a wiring pattern that form the embedded part 6. Such a hole or a slit does not markedly decrease the thermal conductance. As shown in FIGS. 7B and 7C, the respective thermally conductive films have high-density parts 8111, 8121, and 8131 in which relatively few holes and slits are provided and the density of the thermal conductor is high; and low-density parts 8112, 8122, and 8132 in which relatively many holes and slits are provided and the density of the thermal conductor is low. The thermal conductor is desirably continued in a wide range. Owing to this, the high-density parts 8111, 8121, and 8131 are arranged in the orthogonal projection region of the electronic device 10 as possible, and hence the heat radiation performance for the heat generated at the electronic device 10 can be increased.

The thermal conductivity of the thermally conductive film is preferably 1.0 W/m·K or higher, or more preferably 10 W/m·K or higher. Also, the thermally conductive film desirably has a higher thermal conductivity than the thermal conductivity of the base body 20. A typical thermally conductive film is a metal film. Its material may use any of various metal materials, such as gold, silver, copper, aluminum, and stainless steel. If the base body 20 uses a laminated ceramic, metal with a high melting point, such as tungsten, molybdenum, titanium, or tantalum, is desirably used. To prevent the thickness of the base body 20 from being increased, the thickness of the thermally conductive film is preferably smaller than at least the thickness T4 of the frame body 40, or the thickness of the thermally conductive film is more preferably ¹⁄₁₀ of the thickness T4 of the frame body 40 or smaller. If a thermally conductive film having a higher thermal conductivity than the thermal conductivity of the base body 20 is used, the thickness may be 0.1 mm or smaller. As described above, since the frame body 40 for the thermal conduction and the thin thermally conductive film embedded in the base body 20 are used, as compared with the structure of related art in which the heat radiating plate is embedded in the base body 20, both the increase in heat radiation performance and the decrease in thickness can be attained.

An example of a manufacturing method relating to the electronic component 100 is described. FIGS. 8A to 10J are schematic sectional views taken along line A-a in FIGS. 1A and 1B.

Figure 8A:
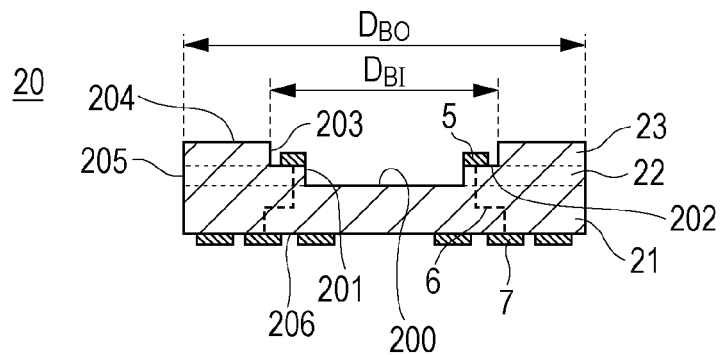
FIGS. 8A to 8C are schematic sectional views of an example of a manufacturing method of the electronic component (a mounting member).

FIG. 8A shows a step a of preparing the base body 20. As described above, in the base body 20, the inner terminals 5, the embedded part 6, and the outer terminals 7 are integrated. Also, the base body 20 has the step part 203 that connects the fiducial stage part 202 and the upper stage part 204, and also has the step part 201 that connects the fiducial stage part 202 and the lower stage part 200. The inner terminals 5 are provided on the fiducial stage part 202.

For such a base body 20, a green sheet that is formed by a sheet forming method, such as a doctor blade method or a calender roller method, is punched with a plate die; a plurality of such punched green sheets are stacked; and hence a plate member of green ceramic is formed. Also, a green sheet, which is similarly formed, is punched with a frame die; a plurality of punched green sheets are stacked; and hence a frame member of green ceramic is formed. The plate member and the frame member are superposed and fired. Accordingly, the laminated ceramic with the concave shape can be fabricated. The inner terminals 5, the embedded part 6, and the outer terminals 7 may be formed integrally with the laminated ceramic through metallizing processing by firing conductive paste patterns that are formed by a screen printing method etc. during the step of stacking the green sheets. The thermally conductive films described with reference to FIGS. 6A to 7D may be formed similarly by using electrically conductive paste.

In this case, a first layer 21 that is a green ceramic plate member, a second layer 22 that is a green ceramic frame member with a small inner diameter, and a third layer 23 that is a green ceramic frame member with a large inner diameter before firing are shown. Since a frame die of the second layer 22 and a frame die of the third layer 23 have different inner diameters, the fiducial stage part 202 can be easily formed. If the base body 20 does not have the lower stage part 200 as shown in FIGS. 3A and 3B, the base body 20 may not be formed of the two kinds (the two layers) of the frame members but may be formed of one kind of the frame member in the example shown in FIGS. 3A and 3B. Accordingly, since the frame die for punching may be one kind, the cost can be decreased. An inner diameter $D_{BI}$ and an outer diameter $D_{BO}$ of the step part 203 of the base body 20 are properly determined in accordance with the size of the electronic device to be mounted.

Figure 8B:
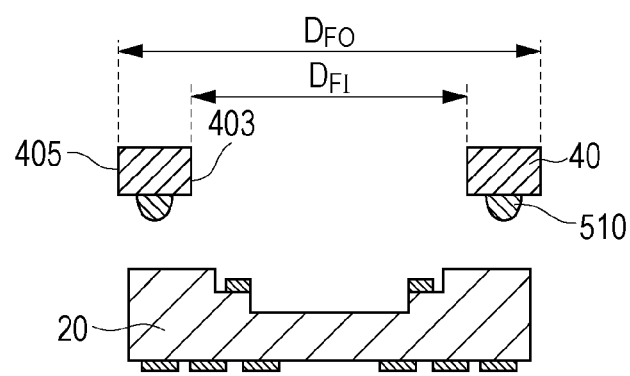

FIG. 8B shows a step b of bonding the base body 20 and the frame body 40. The formed frame body 40 is prepared. It is assumed that $D_{FI}$ is an inner diameter of the frame body 40, and $D_{FO}$ is an outer diameter of the frame body 40. Herein, the relationship between the sizes of the base body 20 and the frame body 40 is $D_{BI} < D_{FI}$. Also, $D_{BO} < D_{FO}$. The surfaces of the frame body 40 desirably have roughness by sandblasting. An adhesive 510 is applied to at least one of the upper stage part 204 of the base body 20 and the joint surface 401 of the frame body 40. As shown in FIG. 8B, the adhesive 510 is desirably applied to only the joint surface 401 of the frame body 40. The frame body 40 is more flat than the base body 20, and hence the application amount of the adhesive 510 can be easily controlled. As described above, the adhesive 510 is typically thermosetting resin. The application of the adhesive 510 may use printing, dispensing, etc.

Figure 8C:
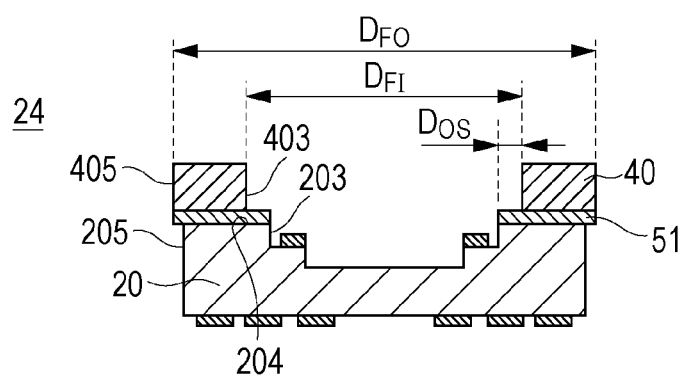

FIG. 8C shows a step c of bonding the base body 20 and the frame body 40. The frame body 40 is mounted on the upper stage part 204 of the base body 20. Herein, the step part 203 of the base body 20 is located at the side of the inner terminals 5 with respect to the inner edge 403 of the frame body 40. An offset amount $D_{OS}$ between the step part 203 and the inner edge 403 at this time depends on the difference between the inner diameter $D_{FI}$ and the inner diameter $D_{BI}$. Typically, $D_{OS} = (D_{FI} - D_{BI})/2$ is established.

Accordingly, as described with reference to FIG. 4A, the facing region facing the frame body 40, and the non-facing region having the width corresponding to the offset amount $D_{OS}$ and not facing the frame body 40 are formed at the upper stage part 204. Of course, the adhesive 510 is liquid at this time. When the frame body 40 is pressed to the base body 20 due to the self-weight of the frame body 40 or a pressure, an excess of the adhesive 510 protrudes from between the frame body 40 and the base body 20. The excessive protruding adhesive 510 is held at the formed non-facing region and by the surface tension at the boundary between the upper stage part 204 and the step part 203, and the adhesive 510 is prevented from adhering to the inner terminals 5. As described above with reference to FIG. 8B, the adhesive 510 may be applied to the base body 20. However, if the adhesive 510 is applied to the base body 20, the adhesive 510 may be applied to the region, which should be the non-facing region, before the frame body 40 is arranged; or the adhesive 510 may not be applied to the region, which should be the facing region. To avoid such a situation, the adhesive 510 is desirably applied to the frame body 40 instead of the base body 20.

Then, the applied adhesive 510 is solidified by a proper method. A suitable adhesive 510 is thermosetting resin that is hardened by heating. Accordingly, the liquid adhesive 510 becomes the solid jointing material 51, and the frame body 40 and the base body 20 are bonded through the jointing material 51. In this way, a mounting member 24 including the frame body 40 and the base body 20 can be manufactured.

Figure 9D:
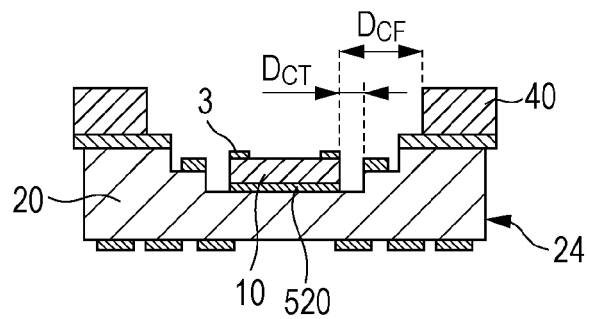
FIGS. 9D to 9G are schematic sectional views of the example of the manufacturing method of the electronic component.
Figure 9E:
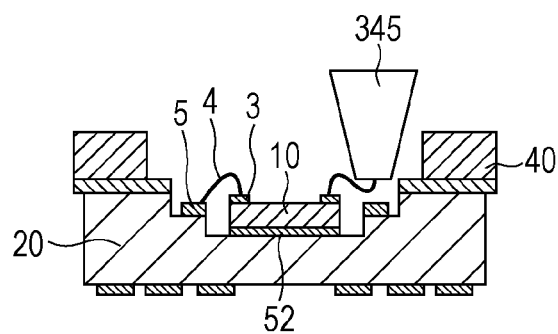

FIG. 9D shows a step d of fixing the electronic device 10 to the base body 20. The electronic device 10 has the electrodes 3. An adhesive 520 such as die bond paste is applied to at least one of the lower stage part 200 of the base body 20 and the back surface 102 of the electronic device 10 (typically, only the lower stage part 200 of the base body 20). Then, the electronic device 10 is arranged on the adhesive 520. Then, as shown in FIG. 9E, the adhesive 520 is solidified, the jointing material 52 is formed, and hence the electronic device 10 and the base body 20 are bonded. FIG. 9E shows a state after the electronic device 10 and the base body 20 are bonded.

FIG. 9E shows a step e of electrically connecting the electronic device 10 with the base body 20. In this example, wire bonding connection is used. One end of a metal wire fed from a distal end of a capillary 345 is connected with the corresponding electrode 3, and then the other end of the metal wire is connected with the corresponding inner terminal 5. The metal wire forms the connection conductor 4. If flip-chip connection is employed, a bump may serve as the jointing material 52 and the connection conductor 4. Herein, the base body 20 has the configuration in which the electronic device 10 is provided on the lower stage part 200, and the fiducial stage part 202 provided with the inner terminals 5 is located above the lower stage part 200. Owing to this, an area in which the capillary 345 may interfere with the step part 203, the upper stage part 204, and the electronic device 10 can be decreased. Thus, the electronic component 100 can be decreased in size.

Figure 9F:
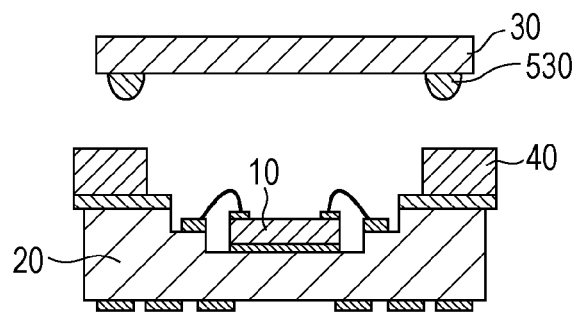

FIG. 9F shows a step f of bonding the lid body 30 to the frame body 40. FIG. 9F shows a state after all the inner terminals 5 and all the electrodes 3 are connected through the connection conductors 4. An adhesive 530 is applied to at least one of the joint surface 402 of the frame body 40 and the joint surface (in this example, the inner surface 302) of the lid body 30. As shown in FIG. 9F, the adhesive 530 is desirably applied to only the joint surface 401 of the frame body 40. The frame body 40 is more flat than the lid body 30, and hence application amount of the adhesive 530 can be easily controlled. As described above, the adhesive 530 is typically photo-curable resin. The application of the adhesive 530 may use printing, dispensing, etc.

Figure 9G:
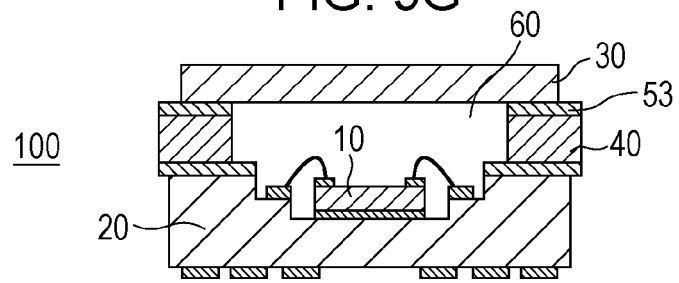

Also, FIG. 9G shows a step g of bonding the lid body 30 to the frame body 40. The lid body 30 is mounted on the frame body 40. Of course, the adhesive 530 is liquid at this time. When the lid body 30 is pressed to the frame body 40 due to the self-weight of the lid body 30 or a pressure, an excess of the adhesive 530 protrudes from between the frame body 40 and the lid body 30. Then, the applied adhesive 530 is solidified by a proper method. Accordingly, the liquid adhesive 530 becomes the solid jointing material 53, and the frame body 40 and the lid body 30 are bonded through the jointing material 53. Photo-curable resin is used as the adhesive 530 by the following reason. When the adhesive 530 is applied to the entire circumference of the joint surface, if a thermosetting adhesive is used as the adhesive 530, the inner space 60 may be thermally expanded when being heated, and the liquid adhesive 530 may be pushed out due to the internal pressure. If a photo-curable adhesive is used, such a phenomenon does not occur. If the photo-curable adhesive is semi-hardened by photo-curing, auxiliary thermosetting may be used for post-hardening. To properly use the photo-curable adhesive 510, the lid body 30 desirably has sufficient optical transmissivity for wavelengths with which the adhesive 510 reacts, such as an ultraviolet ray. In this way, the electronic component 100 can be manufactured.

Figure 10H:
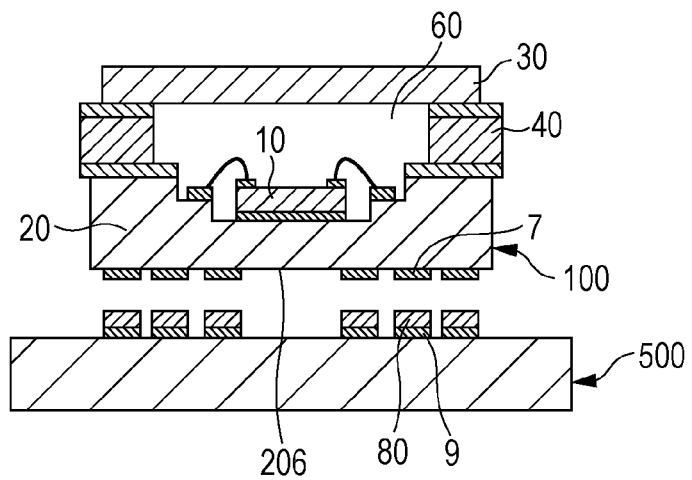
FIGS. 10H to 10J are schematic sectional views of an example of a manufacturing method of an electronic apparatus.

FIG. 10H shows a manufacturing method of an electronic module 600. A wiring member 500 for second-mounting the electronic component 100 fabricated as described above is prepared. The wiring member is, for example, a rigid wiring board, a flexible wiring board, or a rigid-flexible wiring board, and is typically a printed wiring board. Solder paste 80

(solder cream) is applied to connection terminals 9 of the wiring member 500 by a known method such as screen printing. Then, the electronic component 100 is mounted on the wiring member 500, and the solder paste 80 is interposed between the connection terminals 9 and the outer terminals 7.

Figure 10I:
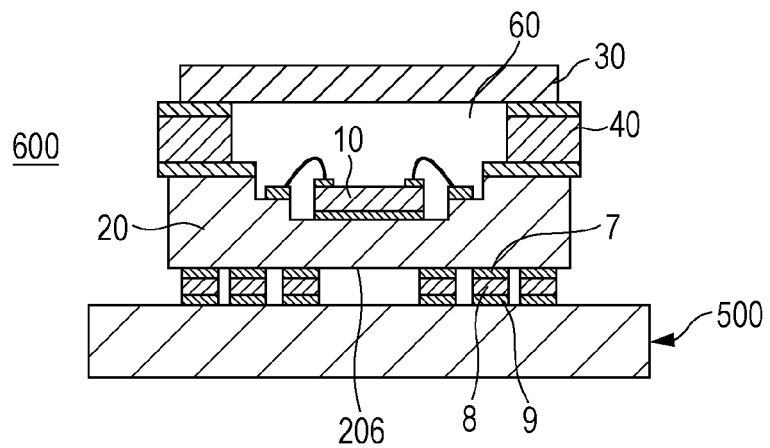

Also, FIG. 10I shows the manufacturing method of the electronic module 600. The electronic component 100 and the wiring member 500 are put into a furnace (reflow oven), the solder paste 80 is fired at temperatures in a range from about 180° C. to 250° C., and solder serving as connection conductors 8 is formed. In this way, the electronic component 100 is fixed to the wiring member 500 by reflow soldering. Thus, the electronic module 600 including the electronic component 100 and the wiring member 500 can be manufactured. It is to be noted that an electronic component other than the electronic component 100, for example, an integrated circuit component, a discrete component, etc., may be mounted on the wiring member 500.

Figure 10J:
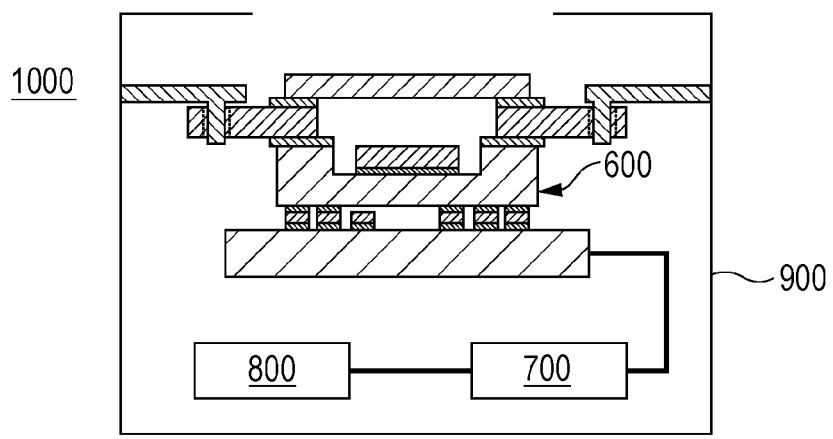

FIG. 10J shows an electronic apparatus 1000. The wiring member 500 of the electronic module 600 is connected with an external circuit 700. The external circuit is, for example, a processor or a memory. The external circuit may be an integrated circuit component. Other electronic component 800 such as a display is connected with the external circuit. These components and circuits are housed in a housing 900, and thus the electronic apparatus 1000 can be manufactured. The extension part 404 for heat radiation provided at the electronic component 100 is thermally connected with the housing 900 or a heat sink that is provided in the housing 900. Accordingly, heat generated at the electronic device 10 is radiated to the outside through the extension part 404. If the outer terminals 7 are located in the orthogonal projection region of the lid body 30 on the base body 20, it may be difficult to radiate heat from the orthogonal projection region of the electronic device 10 on the base body 20. This is because the wiring member 500 with which the outer terminals 7 are connected typically has low thermal conductance. Hence, heat is desirably radiated through the frame body 40.

As described above, the mounting member 24, the electronic component 100, the electronic module 600, and the electronic apparatus 1000 can be manufactured.

EXAMPLE

Hereinafter, an example of the present invention is described. The electronic component 100 shown in FIGS. 2A and 2B was fabricated. The electronic component 100 has a rectangular plate shape with the X direction being the long-side direction and the Y direction being the short-side direction.

For the electronic component 100, the rectangular concave base body 20, in which three alumina ceramic layers with different shapes were stacked, was prepared. The thermal conductivity of alumina ceramic is 14 W/m·K. In the base body 20, the thickness of the plate-shaped first layer 21 is 0.8 mm, the thickness of the frame-shaped second layer 22 (the height of the step part 201) is 0.4 mm, and the thickness of the frame-shaped third layer 23 (the height of the step part 203) is 0.2 mm.

The outer diameter of the first layer 21 in the X direction is 32.0 mm. The outer diameter of the first layer 21 in the Y direction is 26.4 mm. The outer diameter of the second layer 22 in the X direction is 32.0 mm, and the inner diameter thereof is 26.2 mm (the frame width thereof is 2.9 mm). The outer diameter of the second layer 22 in the Y direction is 26.4 mm, and the inner diameter thereof is 19.6 mm (the frame width thereof is 3.4 mm). The outer diameter of the third layer 23 in the X direction is 32.0 mm, and the inner diameter thereof is 26.2 mm (the frame width thereof is 2.9 mm). The outer diameter (corresponding to $D_{BO}$) of the third layer 23 in the Y direction is 26.4 mm, and the inner diameter (corresponding to $D_{BI}$) thereof is 21.4 mm (the frame width thereof is 2.5 mm). The width in the Y direction of the fiducial stage part 202 provided with the inner terminals 5 is 0.9 mm.

The inner terminals 5 and the outer terminals 7 each use a laminate film in which gold plating is applied to a nickel base. The outer terminals 7 are LGA type, and 125 outer terminals 7 are provided.

Next, the frame body 40 made of SUS430 (18% chromium stainless steel) being a ferritic stainless steel was prepared, and thermosetting resin was applied as the adhesive 510 on one surface of the frame body 40 by screen printing. The thermal conductivity of SUS430 is 26 W/m·K. Then, the frame body 40 was mounted on the upper stage part 204 of the base body 20, and a pressure was applied. The pressure was adjusted so that the thickness of the thermosetting resin was in a range from 10 to 50 μm. Then, heat at temperatures in a range from about 120° C. to 150° C. was applied, and thus the thermosetting resin as the adhesive 510 was hardened. To increase an adhesive force to the thermosetting resin, the surfaces of the frame body 40 were processed by sandblasting to obtain a surface roughness Ra in a range from about 0.1 to 0.2 μm, and thus roughness was applied to the front surface. The thickness of the frame body 40 is 0.8 mm, the outer diameter in the X direction thereof is 42.0 mm (in the outer diameter, the widths of the extension parts 404 provided at the left side and right side are each 4.5 mm), and the inner diameter thereof is 27.4 mm. The outer diameter of the frame body 40 in the Y direction is 27.4 mm, and the inner diameter thereof is 22.6 mm. At this time, the offset distance between the inner edge 403 of the frame body 40 and the step part 203 of the base body 20 was 0.60 mm at each of the left side and right side in the X direction, and 0.60 mm at each of the upper side and lower side in the Y direction. Since the inner edge 403 is larger than the step part 203, the entire circumference of the inner edge 403 is located at the outer side of the step part 203 (at the side of the outer edge 205). Also, the frame body 40 protrudes with respect to the outer edge 205 of the base body 20 by 0.50 mm at minimum and 5.0 mm at maximum (corresponding to the extension part 404) at each of the left side and right side in the X direction, and protrudes by 0.50 mm at each of the upper side and lower side in the Y direction. That is, W4 in the X direction is 0.50 mm at minimum, and is 5.0 mm at the extension part 404. Thus, W4>W2. Since the outer edge 405 is larger than the outer edge 205, the entire circumference of the outer edge 405 is located at the outer side of the outer edge 205 (at the side of the outer edge 205). The length W2 of the first portion 410 is 2.3 mm in the X direction and is 1.9 mm in the Y direction. In this way, the mounting member 24 is obtained. T4<W2 is satisfied in the X direction and Y direction. T4<W2<W4 is satisfied in the X direction. T4>W4 is established in the Y direction.

Next, a CMOS image sensor with so-called advanced photo system type-C (APS-C) size was prepared as the electronic device 10. The outer diameter of the electronic device 10 in the Y direction is 18.0 mm, and the thickness thereof is 0.75 mm. The thermal conductivity of the electronic device 10, the main material of which is silicon, may be considered as 160 W/m·K, and the thermal expansion coefficient may be considered as 2.5 ppm/K. This electronic device 10 was fixed by thermosetting substantially at the center of the base body 20, by using the adhesive 520, which was a black die bonding adhesive. Then, the electrodes 3 and the inner terminals 5 provided at the peripheral region of the chip were electrically connected by metal wires with use of a wire bonding apparatus. The distance between the outer edge 105 of the electronic device 10 and the inner edge 403 of the frame body 40 is 1.5 mm in the X direction, and 2.3 mm (corresponding to $D_{CF}$) in the Y direction. Also, the distance between the electronic device 10 and the step part 203 is 0.9 mm in the X direction, and 1.7 mm in the Y direction. The distance $D_{CT}$ between the inner terminals 5 and the outer edge 105 of the electronic device 10 was 0.8 mm.

Next, an α-ray proofed plate member made of silica glass with a thickness of 0.5 mm was prepared as the lid body 30. A thermal conductivity of silica glass is typically about 1.4 W/m·K. The dimension in the X direction of the lid body 30 is 31.8 mm and the dimension in the Y direction thereof is 26.3 mm. The dimensions substantially correspond to the outer diameter of the base body 20. Ultraviolet-curable resin was applied as the adhesive 530 in a frame shape on one surface of the lid body 30 by a dispenser, the lid body 30 was mounted on the frame body 40 such that the surface applied with the adhesive 530 faces the joint surface 402 of the frame body 40, and a proper pressure was applied. At this time, since the spherical particles as spacers each having a diameter of 30 μm were mixed in the adhesive 530, and the thickness of the adhesive 530 was about 30 μm. At this time, it was found that the adhesive 530 protruded from between the lid body 30 and the frame body 40. Then, ultraviolet rays were emitted through the lid body 30 and hence photo-curing processing was performed. Further, as post-hardening, thermosetting processing was performed to harden the adhesive 530, and thus the jointing material 53 was formed. The distance between the front surface 101 of the electronic device 10 and the inner surface 302 of the lid body 30 was 0.75 mm. In this way, the electronic component 100 with a thickness of 2.8 mm is obtained.

Then, the wiring member 500 with a certain size was prepared, the solder paste 80 was applied by printing onto the connection terminals 9 of the wiring member 500, the solder paste 80 was molten in a reflow oven, and thus the electronic component 100 was fixed to the wiring member 500. In this way, the electronic module 600 (an image pickup module) is obtained.

The electronic module 600 was housed in the housing and was fixed to the housing by screwing with use of the through hole 406 of the extension part 404 of the electronic component 100, so that the extension part 404 contacted the housing. In this way, a camera as the electronic apparatus 1000 was fabricated. When the camera was operated, the temperature of the image pickup device was increased to about 70° C. However, it was recognized that heat from the electronic device 10 was radiated to the housing through the extension part 404, and a good image could be obtained for a long time.

Then, by using the base body 20 containing the thermally conductive films as shown in FIGS. 6A and 6B, the electronic component 100 and the electronic apparatus 1000 were fabricated. In the base body 20, tungsten paste patterned on a green sheet was fired and hence ceramic was metallized. Hence, the tungsten film serving as the thermally and electrically conductive film is integrally formed with the base body 20. The thermal conductivity of the tungsten film obtained by firing the tungsten paste is lower than the thermal conductivity (173 W/m·K) of tungsten; however, is 50 W/m·K or higher and is higher than the thermal conductivity of the base body 20 which is alumina ceramic. The thickness of the tungsten film serving as the thermally conductive film is 10 μm. The first thermally conductive film 811, the second thermally conductive film 812, the third thermally conductive film 813, and the fourth thermally conductive film 814 were arranged in two layers in the plate-shaped first layer 21. Also, the embedded part 6 was similarly formed by using the tungsten paste. The first thermally conductive film 811 and the third thermally conductive film 813 extend from a position directly below the arrangement region 210 in a range of 1.0 mm or smaller from the outer edge 205 of the base body 20, and has an area that is at least a half of the area of the electronic device 10. Hence, the first thermally conductive film 811 and the third thermally conductive film 813 extend from the inside of the orthogonal projection region of the electronic device 10 to the inside of the orthogonal projection region of the frame body 40. The tungsten film of each thermally conductive film is sufficiently thin as compared with the thickness (0.8 mm) of the frame body 40. If the two layers of the tungsten films are provided, the thickness of the first layer 21 of the base body 20 is not substantially changed from the above-described thickness of 0.8 mm. The thin electronic component 100 can be obtained. Also, the lid body 30 used borosilicate glass having dimensions equivalent to those of the above-described plate member made of silica glass and having a thermal conductivity of 1.2 W/m·K. A camera was fabricated similarly to the above-described camera and video capturing was performed. As the result, good images could be stably obtained for a long time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103827 filed Apr. 27, 2012 and No. 2013-039451 filed Feb. 28, 2013, which are hereby incorporated by reference herein in their entirety.

What is claimed is:

1. An electronic component, comprising:
    a package that houses an electronic device,
    wherein the package includes
        a base body having a center region to which the electronic device is fixed, and having a peripheral region located at a side of an outer edge of the base body with respect to the center region in a first direction,
        a lid body that faces the electronic device in a second direction, and
        a frame body that encloses at least one of a space between the electronic device and the lid body, and the electronic device,
    wherein the frame body has a first portion located at a side of an inner edge of the frame body with respect to the outer edge of the base body, and a second portion located at a side of an outer edge of the frame body with respect to the outer edge of the base body, in the first direction from the inner edge of the frame body toward the outer edge of the frame body,
    wherein the second portion has a greater length in the first direction than a length of the first portion in the first direction,
    wherein the first portion is located between the lid body and the peripheral region of the base body in the second direction, and a distance between the lid body and the peripheral region of the base body is less than the length of the first portion in the first direction, and
    wherein the frame body has a greater thermal conductivity than a thermal conductivity of the lid body.

2. The electronic component according to claim 1,
    wherein the frame body has a greater thermal conductivity than a thermal conductivity of the base body.

3. The electronic component according to claim 1, further comprising:
a thermally conductive member provided at the side opposite to the side of the lid body with respect to the electronic device, the thermally conductive member extending from an inside of an orthogonal projection region of the electronic device to an outside of the orthogonal projection region of the electronic device, the thermally conductive member having a greater thermal conductivity than a thermal conductivity of the base body,
wherein a thickness of the thermally conductive member is less than a thickness of the first portion in the second direction.

4. The electronic component according to claim 3, wherein the thermally conductive member extends to the inside of an orthogonal projection region of the frame body.

5. The electronic component according to claim 1, wherein the base body has a greater thermal conductivity than the thermal conductivity of the lid body.

6. The electronic component according to claim 1, wherein the first portion and the second portion are made of metal.

7. The electronic component according to claim 1, wherein the second portion has a through hole.

8. The electronic component according to claim 1, wherein the base body is a laminated ceramic.

9. The electronic component according to claim 1, wherein a thermal conductivity of the base body and the thermal conductivity of the frame body are at least 10 W/m·K.

10. The electronic component according to claim 1,
wherein the package includes
an inner terminal electrically connected with the electronic device, and
an outer terminal electrically continued from the inner terminal,
wherein the outer terminal is located to overlap the lid body in the second direction.

11. The electronic component according to claim 1,
wherein the base body includes
an upper stage part located in the center region, and
a lower stage part located in the center region, the lower stage part being recessed with respect to the upper stage part,
wherein the electronic device is bonded to the lower stage part, and the frame body is bonded to the upper stage part.

12. The electronic component according to claim 11, wherein the inner edge of the frame body is located at the side of the outer edge of the base body with respect to a step part arranged between the upper stage part and the lower stage part.

13. The electronic component according to claim 11, further comprising a thermally conductive member located between a step part, which is arranged between the upper stage part and the lower stage part, and an outer edge of the electronic device, the thermally conductive member contacting the step part and the outer edge of the electronic device, the thermally conductive member having a greater thermal conductivity than a thermal conductivity of the base body.

14. The electronic component according to claim 11,
wherein the package includes
an inner terminal electrically connected with the electronic device, and
an outer terminal electrically continued from the inner terminal,
wherein the base body further includes a middle stage part located between the upper stage part and the lower stage part, and
wherein the inner terminal is arranged on the middle stage part.

15. The electronic component according to claim 3, wherein the thermally conductive member is provided in the base body and the thermally conductive member has a thickness of 0.1 mm or less.

16. The electronic component according to claim 1, wherein a material of the frame body is stainless steel.

17. The electronic component according to claim 1,
wherein the first portion has a thickness in the second direction in a range from 0.2 mm to 2.0 mm, and
wherein the first portion has the length in the first direction in a range from 0.5 mm to 5.0 mm.

18. The electronic component according to claim 1, wherein a heat generated in the electronic device is radiated from the frame body.

19. The electronic component according to claim 1, wherein the electronic device is an image pickup device.

20. An electronic apparatus, comprising:
the electronic component according to claim 1, and
a housing that houses the electronic component.

21. The electronic apparatus according to claim 20, wherein the second portion is thermally connected with the housing or a heat sink that is provided in the housing.

* * * * *